United States Patent
Hollars

(12) 
(10) Patent No.: US 6,365,010 B1
(45) Date of Patent: Apr. 2, 2002

(54) SPUTTERING APPARATUS AND PROCESS FOR HIGH RATE COATINGS

(75) Inventor: Dennis R. Hollars, San Jose, CA (US)

(73) Assignee: Scivac, San Jose, CA (US)

( * ) Notice: Subject to any disclaimer, the term of this patent is extended or adjusted under 35 U.S.C. 154(b) by 0 days.

(21) Appl. No.: 09/397,445

(22) Filed: Sep. 16, 1999

Related U.S. Application Data
(60) Provisional application No. 60/107,386, filed on Nov. 6, 1998.

(51) Int. Cl.[7] ............................................. C23C 14/35
(52) U.S. Cl. .......................... 204/192.12; 204/298.09; 204/298.12; 204/298.15; 204/298.21; 204/298.22; 204/298.26; 204/298.28
(58) Field of Search ....................... 204/192.12, 298.09, 204/298.12, 298.15, 298.21, 298.22, 298.26, 298.28

(56) References Cited

U.S. PATENT DOCUMENTS

| | | | |
|---|---|---|---|
| 4,166,018 A | 8/1979 | Chapin | 204/192 R |
| 4,356,073 A | 10/1982 | McKelvey | 204/192 R |
| 4,420,385 A | 12/1983 | Hartsough | 204/192 R |
| 4,445,997 A | 5/1984 | McKelvey | 204/298 |
| 4,466,877 A | 8/1984 | McKelvey | 204/298 |
| 4,851,095 A | 7/1989 | Scobey et al. | 204/192.12 |
| 5,169,509 A | 12/1992 | Latz et al. | 204/298.03 |
| 5,262,028 A | 11/1993 | Manley | 204/192.12 |
| 5,338,422 A | 8/1994 | Belkind et al. | 204/192.12 |
| 5,384,021 A | 1/1995 | Thwaites | 204/298.21 |
| 5,417,833 A | 5/1995 | Harra et al. | 204/298.2 |
| 5,489,369 A | 2/1996 | Bjornard et al. | 204/298.25 |
| 5,518,592 A | 5/1996 | Bower et al. | 204/192.12 |
| 5,645,699 A | * 7/1997 | Sieck | 204/192.12 |
| 5,753,092 A | 5/1998 | Hollars et al. | 204/298.26 |
| 5,814,195 A | 9/1998 | Lehan et al. | 204/192.12 |

FOREIGN PATENT DOCUMENTS
| | | | |
|---|---|---|---|
| WO | 92/01081 | * 1/1992 | C23C/14/34 |

OTHER PUBLICATIONS

Strong, J., *Procedures in Experimental Physics*, Prentice-Hall, Inc., NY, Copyright 1938, Thirteenth Printing 1947, 159–165.

Shatterproof Glass Corporation, "Rotatable Magnetron Sputtering Source", *Solid State Technology*, Apr. (1986) 63–64.

M. Scherer, J., et al, "Reactive Alternating Current Magnetron Sputtering of Dielectric Layers", *J. Vac. Technol. A*, vol. 10(4), Jul./Aug. (1992) 1772–1776.

U.S. Patent Disclosure Document No. 443110 dated Jul. 27, 1998.

U.S. Patent Disclosure Document No. 444066 dated Sep. 14, 1998.

* cited by examiner

*Primary Examiner*—Nam Nguyen
*Assistant Examiner*—Steven H. VerSteeg
(74) *Attorney, Agent, or Firm*—Oppenheimer Wolff & Donnelly LLP; Claude A. S. Hamrick; Anthony B. Diepenbrock III

(57) ABSTRACT

A sputtering apparatus and method for high rate deposition of electrically insulating and semiconducting coatings with substantially uniform stoichiometry. Vertically mounted, dual rotatable cylindrical magnetrons with associated vacuum pumps form semi-isolated sputtering modules, which can be independently controlled for the sequential deposition of layers of similar or different materials. Constant voltage operation of AC power with an optional reactive gas flow feedback loop maintains constant coating stoichiometry during small changes in pumping speed caused by substrate motion. The coating method is extremely stable over long periods (days) of operation, with the film stoichiometry being selectable by the voltage control point. The apparatus may take the form of a circular arrangement of modules for batch coating of wafer-like substrates, or the modules may be arranged linearly for the coating of large planar substrates.

60 Claims, 18 Drawing Sheets

SPUTTERING APPARATUS AND PROCESS FOR HIGH RATE COATINGS

REFERENCE TO RELATED APPLICATIONS

This application claims the benefit of U.S. Provisional Application No. 60/107,386, filed Nov. 6, 1998 entitled "Sputtering Apparatus and Process for High Rate Coatings".

BACKGROUND OF THE INVENTION

1. Field of the Invention

This invention relates generally to physical vapor deposition (PVD) coating systems and processes, and more particularly to sputtering machines utilizing one or more pairs of dual cylindrical rotary magnetrons operated in a manner which gives high deposition rates with excellent process control and long term operating stability. The design of the sputtering apparatus and process makes it especially useful for depositing electrically insulating (dielectric) and semiconducting coatings on a variety of substrates. Products benefiting from this technology include but are not limited to computer recording heads, flat panel displays, integrated circuits, computer memory disks, and a variety of coated glass products.

2. Brief Description of the Prior Art

The methods commonly used for depositing thin film coatings in vacuum generally can be classified as physical vapor deposition (PVD) or chemical vapor deposition (CVD) processes. PVD methods can be divided into evaporation (thermal energy source) and sputtering (plasma energy source). Both evaporation and sputtering have enjoyed successful application in various product lines. Evaporation has been used mostly for coating relatively small substrates. Some examples of high tech products include eyeglasses, filters, optical windows of many types, lenses, and laser optics. These products rely heavily on dielectric coatings for their functionality. Large evaporative coating machines are used for less sophisticated metallic coatings on rolls of substrate. Typical products include food packaging, decorative coatings, and the surface coating (corrosion treatment) of rolls of steel.

The sputtering phenomenon was recognized before evaporation, but evaporation technology was developed first because sputtering deposition rates were initially so low that it was not considered useful. A familiar example of low sputtering rate is the slow erosion of the tungsten filaments of ordinary incandescent light bulbs. They are very slowly sputtered by the argon gas used to fill the bulb to protect the hot filament from oxidation. The material removal rate is so slow that only a slight discoloration is noticed on the inside of the glass envelope after many hours of use. The early development of sputtering technology used a simple cathode and anode (diode) placed in a vacuum system with the cathode formed from the metal to be sputtered. Direct current (DC) in the range of 1,000 to 20,000 volts was the most commonly used power source. The process was able to produce an opaque metal coating on glass (a mirror) in about an hour to several hours depending upon the metal used. A description of the early sputtering process is given by J. Strong in "Procedures in Experimental Physics" copyrighted in 1938.

Sputtering became a more commercially viable process with the invention of the planar magnetron, U.S. Pat. No. 4,166,018 issued to Chapin and entitled "Sputtering Process and Apparatus". This patent described a sputtering apparatus in which a magnetic field is formed adjacent to a planar sputtering surface with the field comprising arching lines of magnetic flux over a closed loop erosion region on the sputtering surface. A key enabling feature of the device was that the magnetic field lines penetrated the target material. The erosion region took the form of an annular erosion zone over the target material. The annular erosion zone is referred to, among those skilled in the art, as the "racetrack" because of its elongated shape on a rectangular planar magnetron. On round planar magnetrons, the "racetrack" usually has a circular shape, but it can have other shapes as dictated by the design of the magnet array so long as the racetrack is a closed loop. The magnetrons were almost always operated with DC power, and the phrase "DC Magnetron Sputtering" became the way the process was usually referred to. The erosion process caused heating in the annular erosion zone, which had to be removed by cooling the target material either directly or indirectly with water.

Industrial use of DC magnetron sputtering for the deposition of metallic films increased during the late 1970's and early 1980's. Large sputtering machines were built to coat solar heat reducing reflective films on windows for large commercial buildings and for other applications. For large substrates, it was superior to evaporation for controllability and uniformity. And, although the deposition rates were not as high as for evaporation, sputtering had become an economically useful process. Initially, in the erosion zone, early magnet arrays created a relatively sharp cross-section in the target material. A large metal target plate would quickly "burn through," resulting in very poor utilization of the material. Increased target life was achieved (i) by improving the design of the magnet array to widen the erosion zone on the surface of the target, (ii) by increasing the magnetic field strength to operate with thicker targets, and (iii) by mechanisms which moved the arrays to widen the erosion zone during operation. U.S. Pat. No. 5,262,028 issued to Manley and entitled "Planar Magnetron Sputtering Magnet Assembly" is an example of an improved design for the magnet array to widen the erosion zone. U.S. Pat. No. 5,417,833 issued to Harra et al and entitled "Sputtering Apparatus Having a Rotating Magnet Array and Fixed Electromagnets" is an example a circular planar magnetron with a rotating magnet array to improve target utilization.

Another approach to improving the utilization of the target material was taught in U.S. Pat. No. 4,356,073 issued to McKelvey. The target material was formed into a straight (constant diameter) tube, which was rotated around its cylindrical axis with internal racetrack magnets that were held fixed with respect to the substrate. In this embodiment the target material (the tube) becomes thinner as the process proceeded and no "burn through" in the erosion zone occurs. Its initial use was for the large scale coating of metal films on architectural glass by DC magnetron sputtering. The magnetron coated only one side of the glass substrate in the horizontal position. Later U.S. Pat. No. 4,445,997 again issued to McKelvey disclosed another rotatable sputtering magnetron in which the target tube was contoured longitudinally to match the geometry of a substrate with the shape of an automobile windshield. This magnetron was also designed for use in the horizontal position. In U.S. Pat. No. 4,466,877 McKelvey describes a pair of rotatable cylindrical magnetrons mounted horizontally and spaced in a parallel relationship to each other such that the sputtered flux directed inwardly and downwardly from each is focused on the same region of the substrate. Further details of this dual embodiment are given in an article by Shatterproof Glass Corporation entitled "Rotatable Magnetron Sputtering Source", *Solid State Technology,* April 1986. Two important points from the article are first, the magnetrons are rotated at speeds from 1 to 12 RPM, and second, the horizontal mounting for sputtering downward on glass causes the target cooling water to be fed through two rotating seals in vacuum, causing reliability problems and limiting rotation speeds.

In addition to the sputtering of metal films, DC reactive magnetron sputtering has been developed for the deposition of insulating (dielectric) and semiconducting coatings; in particular, for the deposition of the oxides and nitrides of metals. In reactive sputtering, the inert working gas is usually argon and the added reactive gas is often oxygen and/or nitrogen. The coating of dielectric materials can be accomplished by RF sputtering of the dielectric material itself used as the target. However, in both RF diode and RF magnetron modes the deposition rates are very low. Despite the low rates, this form of sputtering is still used in the production of thin film recording heads and integrated circuits. DC reactive magnetron sputtering of insulating films has the potential advantages of higher deposition rates and lower costs, but good process control and long term stability have been difficult problems to solve for the deposition of the highly insulating metal oxides and nitrides.

There are three characteristics of reactive DC magnetron sputtering that cause issues with control and process stability. One characteristic is generally referred to as "target poisoning" by the reactive gas. Poisoning is the term used to describe the phenomenon where, for example, oxygen reacts with the metal target surface to form an oxide. Sputtering rates for oxides are usually an order of magnitude or more less than that for the pure metal. The natural tendency for the magnetron is to be most stable in the "metal mode" or the "oxide mode" (poisoned), while the desired operating point is often between the two where the process is highly unstable. One reason for the instability is that the partial pressure of the reactive gas (e.g. oxygen) that is required at the substrate to form the insulating film is also adequate to substantially poison the target. Conventionally, some means of partial pressure separation of the reactive gas between the magnetron and the substrate has been attempted to achieve process stability. Examples include U.S. Pat. No. 4,851,095 issued to Scobey et al; U.S. Pat. No. 4,420,385 issued to Hartsough; Scherer et al, "Reactive High Rate DC Sputtering of Oxides", Thin Solid Films, Vol. 119 (1984) 203–209; Schiller et al, "Reactive DC Sputtering with the Magnetron-Platatron for Titanium Pentoxide and Titanium Oxide Films", *Thin Solid Films,* Vol. 63 (1979) 369–373; and Schiller et al, "Advances in High Rate Sputtering with Magnetron-Plasmatron Processing and Instrumentation", *Thin Solid Films,* Vol. 64 (1979) 455–467. These techniques cover the range from placing baffles partially between the magnetron and substrate and injecting the reactive gas only near the substrate, to completely separating the deposition region from the reaction region by moving the substrate. The method of Hartsough was improved and expanded by Scobey. A metallic film was deposited on substrates in one area of the machine and the substrates were then moved to another area of the machine for reaction (e.g. oxidation) to form a transparent optical film. Although they obtained relatively high net deposition rates, they were still limited by the reaction rate of the metallic film with oxygen that could be achieved in the separated reaction zone. Additionally, this separation of zones clearly limits the number of magnetrons and reaction zones which can be placed in a given vacuum chamber to half of the number of magnetrons which could otherwise be used, thus further limiting the net deposition rate of the system. In many of the examples the films required a post operation bake at elevated temperatures to fully complete the reaction.

An elaborate gas separation scheme is described in U.S. Pat. No. 5,338,422 issued to Belkind et al. It teaches a triple magnetron array consisting of a rectangular planar and two rotatable cylindrical magnetrons with unbalanced magnet arrays. The planar magnetron is partially shielded by a baffle from the rotatables, and argon (inert working gas) is injected near the planar which is operated in metal mode, while oxygen is injected near the rotatables. In another example of a gas separation apparatus U.S. Pat. No. 5,384,021 issued to Thwaites describes a machine in which a single rotatable cylindrical magnetron is augmented with supplementary magnets and reactive and ionizable gas remote form the sputtering zone.

A second control and process stability problem involves changes in the electrical circuit of the magnetron. With a few exceptions most metal oxides and nitrides are good electrical insulators. During operation, insulating material builds up on the shields, walls, and other structures in the vacuum system, causing the electrical resistance through the plasma to the anode and any other return path back to the power supply to become higher and higher. This shift in the electrical resistance in the power circuit causes a process drift, which is difficult to control while keeping the film properties constant with time. U.S. Pat. No. 5,169,509 ('509) issued to Latz et al describes a dual rectangular planar magnetron apparatus operated by ungrounded AC power in the frequency range of 1 kilohertz to 100 kilohertz. No reference was made in '509 of the ability of AC operation to help minimize the problem with changes in circuit resistance, but it is obvious in retrospect that they were on the right track. In fact, a paper by Scherer et al (including Latz) entitled "Reactive Alternating Current Magnetron Sputtering of Dielectric Layers" that was publish soon after '509 was filed, clearly pointed out the well defined anode characteristics of the AC operation. More recently, U.S. Pat. No. 5,814,195 ('195) issued to Lehan et al discusses the advantage of using AC power on dual rotatable magnetrons for anode stabilization in a very similar manner to that described by Scherer et al.

A third characteristic of reactive DC sputtering, which causes process difficulties, is the arcing phenomenon. While insulating material is building up on various structures in the vacuum system, it is also building up on non-sputtered regions of the sputtering target. This is more severe for pairs of magnetrons that are operated facing each other in order to coat both sides of a substrate simultaneously. During operation the insulating regions are constantly being bombarded by ionized inert sputtering gas (e.g. argon) which removes electrons and leaves a net positive charge on the insulating surface. Eventually, the voltage difference between the negatively charged target plate and the positively charged insulating surface reaches breakdown potential for the insulator and arcing occurs. This arcing has at least two negative consequences. First, it can disrupt the process control system, and second, it can damage the coating in a number of ways. Physical damage can occur by the arc striking the coating, the ratio of metal atoms to reactive gas atoms (stoichiometry) in the coating can be changed in the vicinity of the arc, and the arc can create particulate debris, which can get into the coating. Rotatable cylindrical magnetrons help to minimize the arcing problem because the build up of the dielectric on the active part of the target is largely prevented by the rotation (if it is rapid enough). However, there is buildup of dielectric along the outer edges of the sputtering region where arcing can still occur. Since the rotatable magnetrons are primarily used in horizontal sputter down orientation, particulate debris can be a major problem for many coating applications. AC operation of the magnetrons, as described in '509 and '195, helps to reduce arcing because the positive charge buildup on the insulating surface tends to be neutralized on each half cycle. The paper by Scherer et al explains the details of the arcing phenomenon in sputtering, and the improvement that AC operation provides. But, the arcing is not totally eliminated largely because the buildup of insulating material on the non-sputtered regions of the planar target surface becomes excessive after long periods of operation. The improvement of '195 simply substitutes rotatable magnetrons for the planar magnetrons of '509 in order to reduce the buildup of insulating material on the target surface because of the continuous rotation of the target surface past the sputtering zone. While the buildup of insulating material on rotatables is most severe at the ends of the sputtering zone, it is still significant on the sputtered surface. Indeed, the method of '195 relies upon connecting the power supply to the magnetron through a transformer and an impedance-limiting capacitor to reduce arcing. The current art still fails to provide a completely satisfactory solution to arcing for long term operation.

The deposition of the protective overcoat for computer memory disks is a good example of how the arcing problem affects a product. Carbon is sputtered in argon plus hydrogen or a hydrogen containing gas to form a hard. insulating "diamond like carbon" (DLC) protective overcoat layer. Both sides of the disk are coated simultaneously by pairs of facing magnetrons, so the buildup of insulating material on the non-sputtering regions of the target surfaces is relatively rapid. Particulate debris caused by arcing is a major source of reduced yields industry wide. AC operation offers some improvement but has done little to eliminate the problem.

Another problem with the current art is that the geometrical arrangement of the magnetrons with respect to the substrate in coating machines can cause variable stoichiometry in the deposited insulating film. Most often the substrate is caused to pass by and below the magnetron, in a direction perpendicular to its length, by some mechanical transport means. Since the partial pressure of the reactive gas near the substrate is constant, the instantaneous deposition rate over the deposition region also needs to be constant if the resulting film is to have uniform stoichiometry. This is not normally the case, and to correct it in the current art requires shielding the deposition region to a narrow slit across which the deposition rate is approximately constant. This lowers the efficiency of the use of the available deposition flux by more than fifty percent. Variability of coating stoichiometry has not been a problem for optical films (so long as they are clear), but it can be a significant issue for products that require subsequent processing, or have requirements related to levels of stress. Post deposition chemical etching of the coating is an example in which variable film stoichiometry would not be acceptable. Also, semiconducting films which must be optically transparent and maintain a modest but uniform electrical conductivity, need to have uniform stoichiometry.

Process control for reactively depositing insulating films at high rate traditionally has been very difficult. Baffles, which provided some separation of the partial pressure of the reactive gas between the target and the substrate, allowed operation for a short time at the edge of the "poisoned" mode, with only slightly improved deposition rates when compared to no baffling. However, invariably the process drifts due to vacuum system cleanup, contamination drag in from the substrates, target erosion, substrate motion, and other factors. An improvement in process control for depositing insulating films was described in '509, which used a feedback circuit to vary the flow of reactive gas to hold the plasma potential at a constant desired value. This gave improved control and increased deposition rates, but the feedback loop is unstable against arcs, and for some films, aluminum oxide for example, there are two values of voltage corresponding to two different film compositions for the same reactive gas flow. The system is unstable for these types of films, and can transition quickly from one voltage to the other.

A prior art sputtering apparatus for the deposition of dielectric materials using an AC power supply is described by Lehan et al in the previously cited U.S. Pat. No. 5,814, 195. FIG. 1a is the schematic diagram of the AC powered sputtering system 1 of Lehan et al. A chamber 2 is fitted with a pair of horizontally mounted rotatable cylindrical magnetrons 3a supporting tubular targets 3b positioned over substrate 4. The two poles of an AC power source 5 are connected to a transformer 6, whose output is connected to magnetrons 3a, 3b through fixed and variable impedance-limiting capacitors 7. Magnet assemblies 8 create sputtering erosion zones on the surfaces of the tubular targets. This apparatus is practically identical to that taught by Latz in '509 with the planar magnetrons of '509 simply being replaced by rotatable cylindrical magnetrons. Lehan et al in '195 claim that the rotation of the target past the erosion zone cleans the dielectric buildup material off the target in portions away from the erosion zone to help reduce arcing. While this is an obvious aid in reducing arcing, a better solution which eliminates arcing would not require the transformer 6 and capacitors 7.

FIG. 1b is the enlarged schematic diagram of magnet assemblies 8 inside tubular targets 3b of FIG. 1a. Magnets 9a, 9b, and 9c in one tubular target and magnets 10a, 10b, and 10c in the other tubular target produce parallel containment areas (for electrons) 11a and 11b that form erosion zones defined by magnetic fields 12a and 12b. Nothing is specified about the polarity of the magnets, except by implication from the schematic shape of the magnetic fields, magnet 9b is opposite to 9a and 9c and 10b is opposite to 10a and 10c. In the figure all of the magnets point radially away from the geometrical centers of tubular targets 3a. Distance 13 between the magnetrons is stated to be about 1–3 inches, while distances 14 and 15 from the (grounded) chamber walls should be about four or more inches. This geometrical arrangement causes the sputtered flux to be non-uniform across the deposition region at the substrate.

Prior art sputtering equipment and processes fail to provide an economical and workable solution for obtaining controllable high rate deposition of insulating and semiconducting films in a demanding (especially high tech) manufacturing environment. Each of the methods previously described suffers from one or more of the problems commonly associated with reactive sputtering. What is needed is an improved sputtering apparatus and control process for high rate deposition of insulating and semiconducting films that does not require complex geometrical baffling for reactive gas partial pressure separation, physically separate coating and reaction zones, arc suppression circuit additions, or post deposition heat treating. In applications for high tech products, the particulate debris from all sources including arcing and coating flaking from baffles and shields must be reduced to an absolute minimum; and, the film stoichiometry must be kept uniform throughout the thickness of the film. Additionally, the process must minimize heating of the substrate during deposition.

All of the patents and references cited above and U.S. Pat. No. 443,110 dated Jul. 27, 1998 and U.S. Pat. No. 444,066 dated Sept. 14, 1998 are hereby incorporated by reference for purposes of additional disclosure.

SUMMARY OF THE INVENTION

Accordingly, it is an object of the present invention to provide an apparatus and process for coating substrates with dielectric or semiconducting films at high deposition rates.

A second object of the present invention is to provide a deposition process that is stable and can be accurately controlled over extended periods of operation of the apparatus.

Another object of the present invention is to provide an apparatus and process, which produces dielectric and semiconducting films with controlled and uniform stoichiometry.

Yet another object of the present invention is to provide an apparatus and process for depositing insulating films with greatly reduced levels of particulate debris from arcing and flaking.

In accordance with one aspect of the present invention the deposition apparatus comprises at least one set of improved dual rotatable cylindrical magnetrons mounted vertically in a vacuum chamber. Associated with the set of magnetrons are baffles, shielding, a vacuum pump (or pumps), and appropriate valving which together constitute a semi-isolated sputtering enclosure or module. The preferred vertical mounting of the magnetrons (in the direction of the gravitational force) allows the target tubes to be relatively long compared to their diameter, so they can be mounted in close proximity to each other without intermittent contact and cracking caused by mechanical deformation. The magnet assemblies are intentionally, (i.e. contrary to the conventional art) designed to provide very narrow erosion zones along the parallel sides of the racetrack (the parallel sides of each racetrack approaching a pair of line sources) for each magnetron. These parallel erosion zones have a highly concentrated plasma density for rapid sputtering of the target and any reactive material. Also, they enable sputtering at low pressures, which yields films formed at higher average energy per deposited atom. The very narrow, high plasma erosion zones allow a lower threshold rotational speed for acceptable magnetron operation because they are effective in keeping the magnetron operating in metal mode even in the presence of a relatively high partial pressure of reactive gas. The distance between the narrow, high plasma parallel erosion zones, the placement of the vertically mounted substrate with respect to the magnetrons, and the pointing angles of the racetracks toward the substrate and each other, are optimized to form a relatively wide and efficient (above 75%) constant flux deposition region at the substrate. This allows high deposition rates at constant reactive gas partial pressures with substantially uniform film stoichiometry. The rotatable cylindrical design, if properly implemented, can have high flow rates of cooling water to allow sputtering at higher energy densities and higher deposition rates than is possible on typical planar magnetrons. Vertical mounting of the magnetrons minimizes substrate particulate contamination due to flaking from shields and adjacent structures. A very significant improvement in design is the elimination of all rotating water seals in vacuum, which provides reliable operation at rotation rates higher than 1 to 12 RPM.

According to another aspect of the present invention, several beneficial properties are obtained from the operation of the dual rotatable magnetrons with AC power in the frequency range of approximately ten to hundreds of kilohertz. In this mode the poles of the AC power supply are connected directly across the electrodes of the dual rotatable magnetrons which are electrically floating (not grounded). The combination of the AC operation with the high plasma density erosion zones previously described insure that when one magnetron is sputtering on the negative cycle of the AC power, the other magnetron provides a low and constant electrical resistance return path to the power supply. Both the high power density of the plasma and the proximity of the racetrack erosion zones, due to the racetracks being angled toward each other, provide greatly improved coupling between the magnetrons in comparison to '751 and '195. As a result of this arrangement no other part of the vacuum system mechanical structure is required to be electrically conductive, and therefore such structures could be made entirely from insulating materials if desired. It may be desirable for the structures near the magnetrons to have electrically insulating surfaces (i.e. a coating) to insure that the process remains electrically constant from startup. The frequency of the AC power may be selected (over a wide range) to minimize material specific arcing, and to provide more efficient formation of monatomic species from diatomic reactive gas molecules by taking advantage of frequency resonances in their dissociation characteristics.

According to still another aspect of the present invention, process control is greatly improved by operating the AC power circuit at a constant pre-selected voltage while the pumping speed of the system, the flow of sputtering gas, and the flow of reactive gas are also held constant. It is found that these parameters fix the stoichiometry of the depositing film, and the process will remain stable over long periods of operation. The process has minimal sensitivity to the way the reactive gas is added to the system in the sense that elaborate schemes of baffles to provide physical separation of the partial pressure of the reactive gas between target and substrate are not needed. If several sets of dual magnetrons are to be operated in the same vacuum chamber, it is advantageous to array them in semi-isolated enclosures with dedicated pumps and baffles between the different sets of magnetrons (i.e. to form modules as previously described) to reduce any cross talk between control loops.

An advantage of the present invention is that the new apparatus and process can produce electrically insulating and semiconducting coatings at very high deposition rates for extended periods of time.

Another advantage of the present invention is that the electrically insulating and semiconducting coatings have a high degree of stoichiometric uniformity as compared to the coatings produced using the prior art.

Yet another advantage of the present invention is that it provides dielectric coatings, produced by high energy, low-pressure deposition process, which have superior density, hardness, and adhesion.

A further advantage of the present invention is that the use of baffles to maintain partial pressure separation of the reactive gas between the target and the substrate, and the injection of the reactive gas only near the substrate can be eliminated.

Still another advantage of the present invention is that it can process multiple wafer substrates simultaneously at high throughput, thus reducing manufacturing and clean room floor-space requirements by approximately an order of magnitude for the same total output.

DRAWINGS

These and other features, aspects and advantages of the present invention will become better understood with regard to the following description, appended claims, and accompanying drawings where:

FIG. 1b shows a cross-sectional view of the cylindrical magnetrons used with the prior art sputtering system shown in FIG. 1a;

Figure 4A:
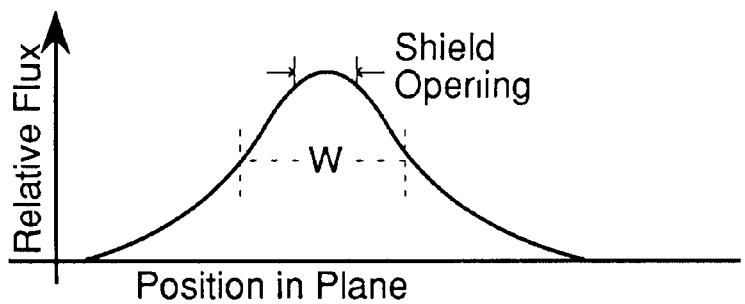
Figure 4B:
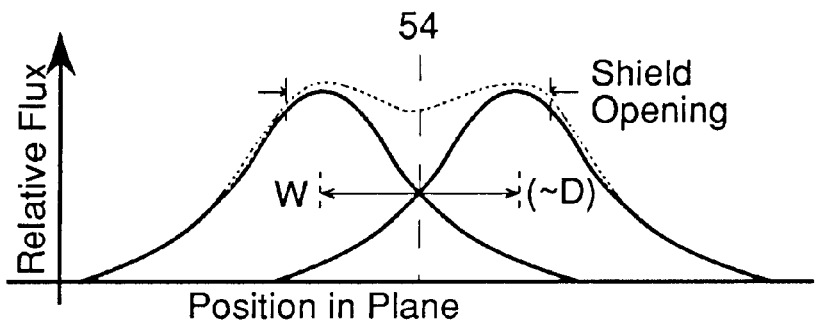
Figure 4C:
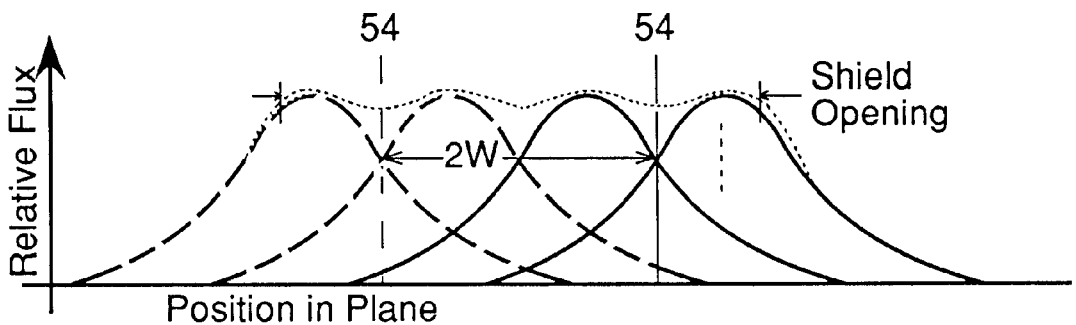
Figure 4D:
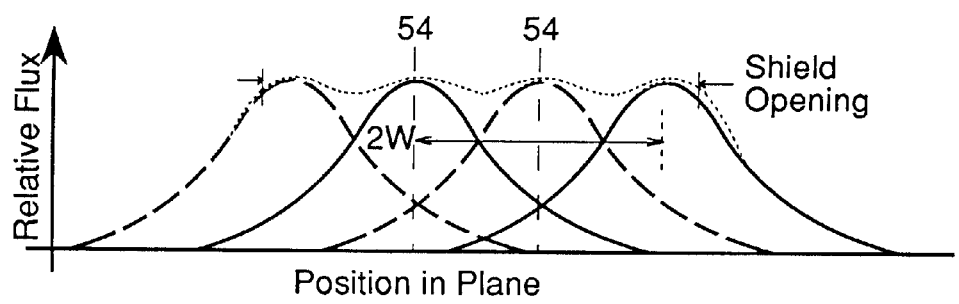
Figure 5A:
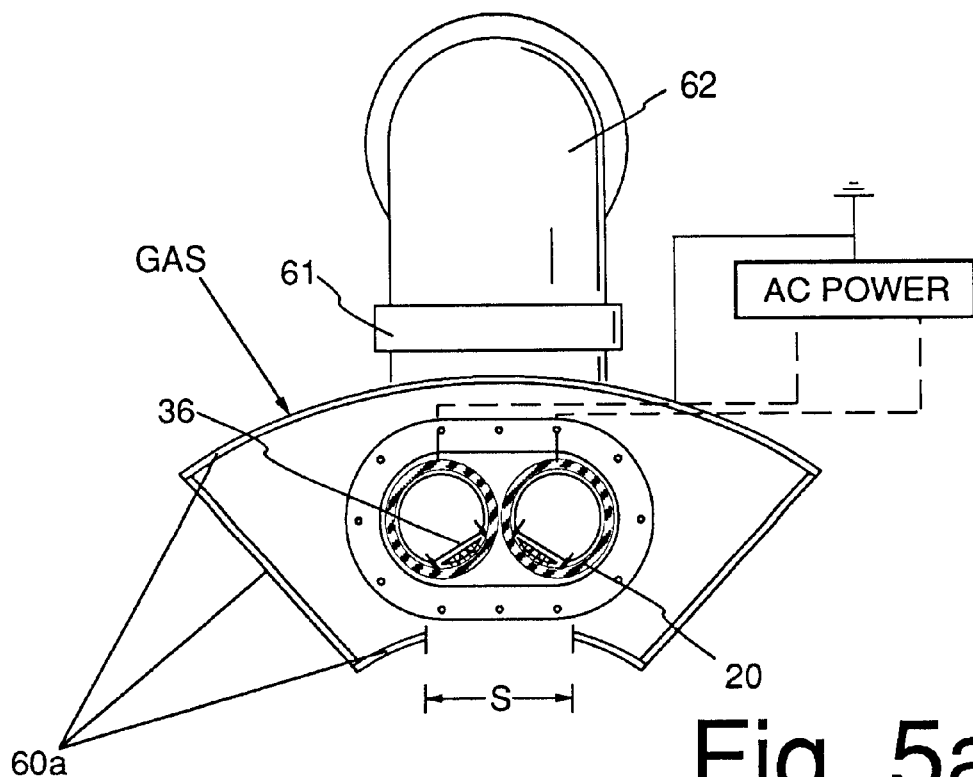
Figure 5B:
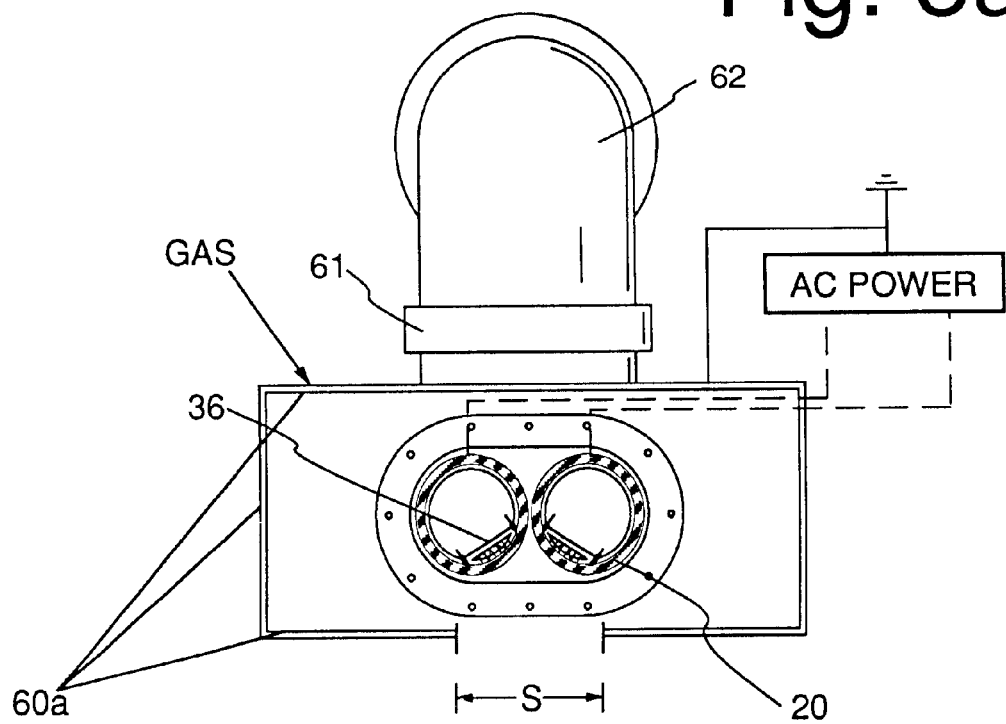
Figure 6:
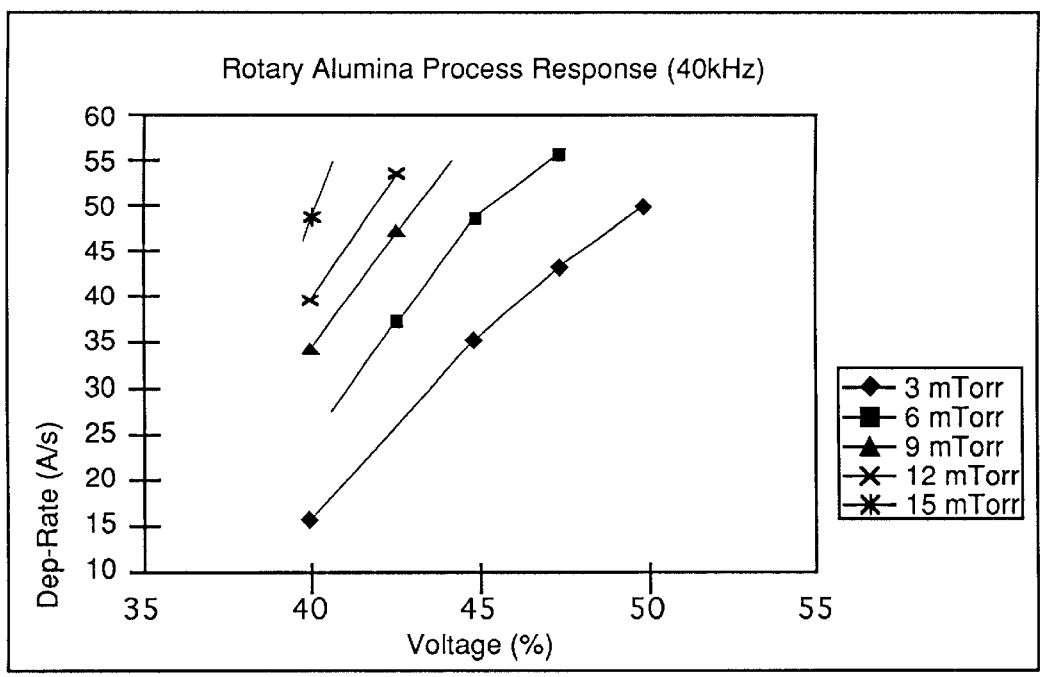
Figure 7:
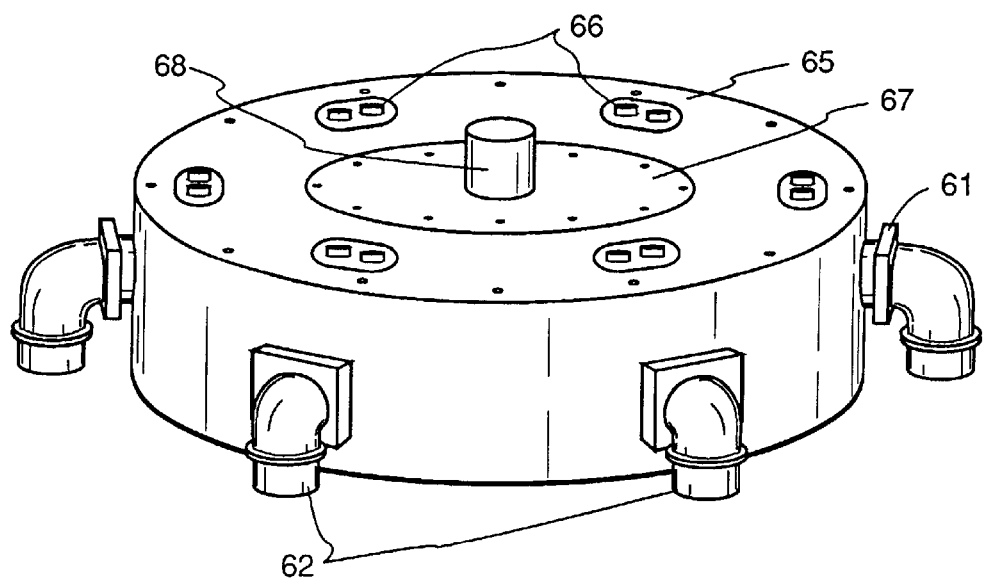
Figure 8A:
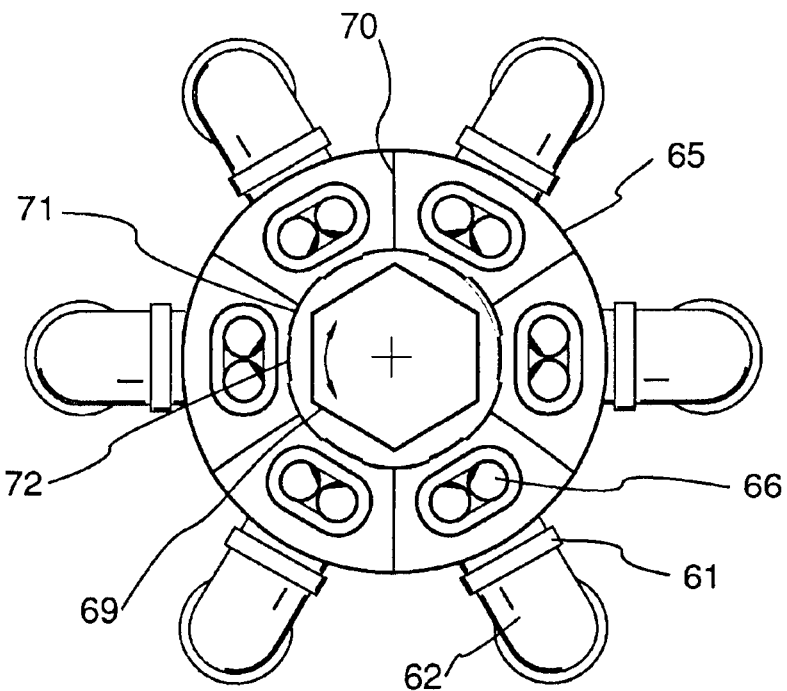
Figure 8B:
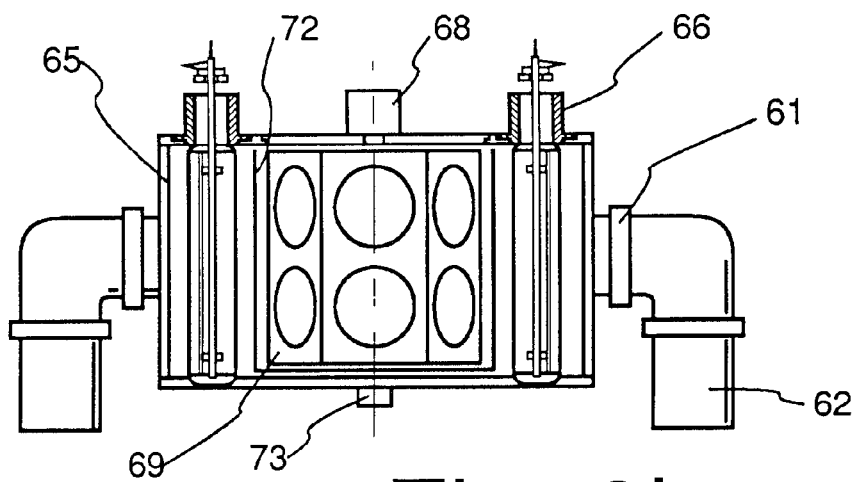
Figure 9A:
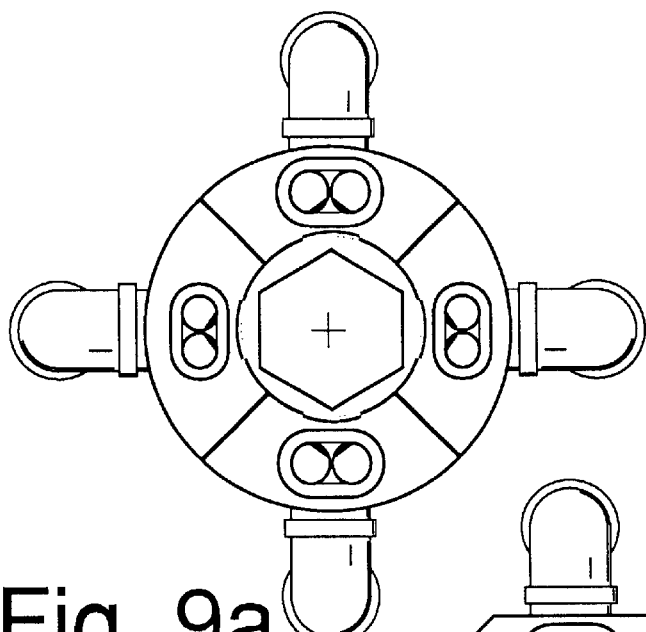
Figure 9B:
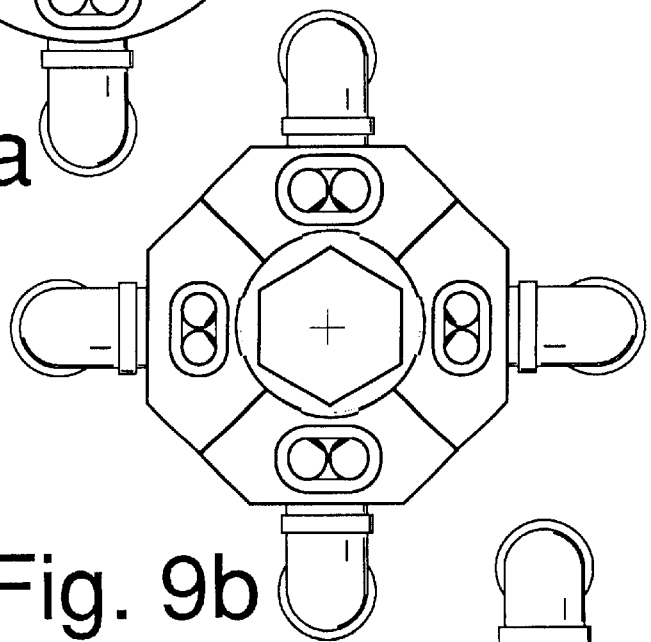
Figure 9C:
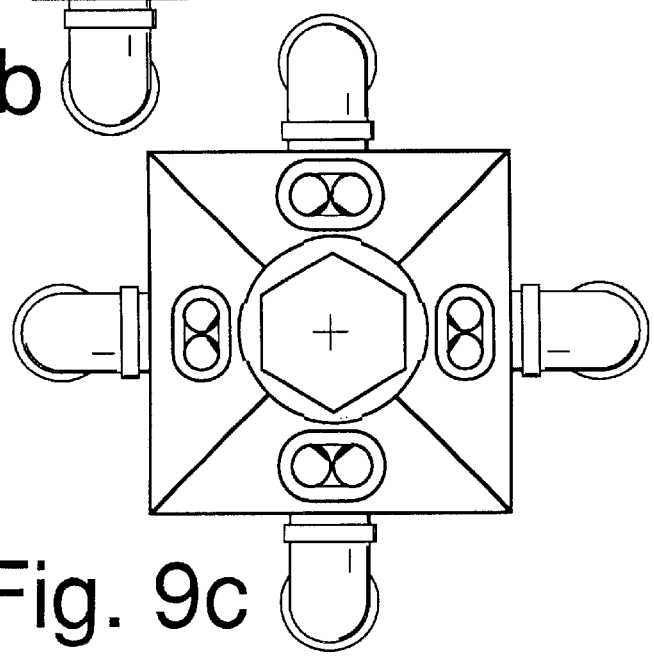
Figure 10A:
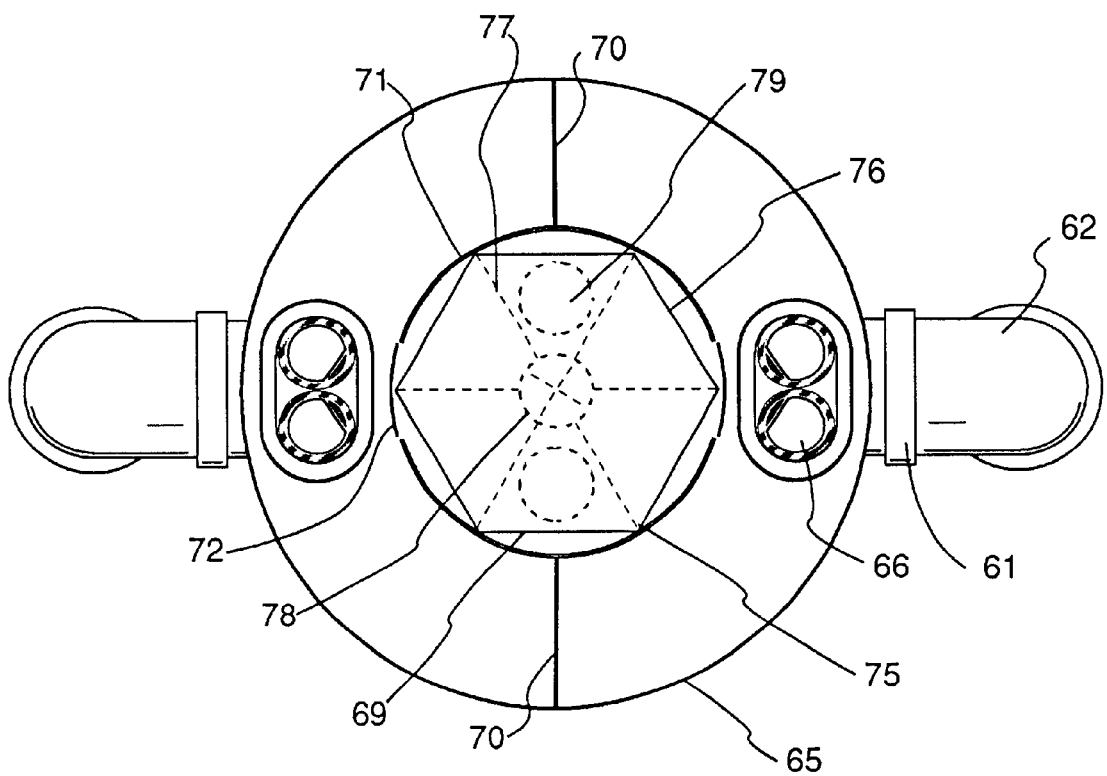
Figure 10B:
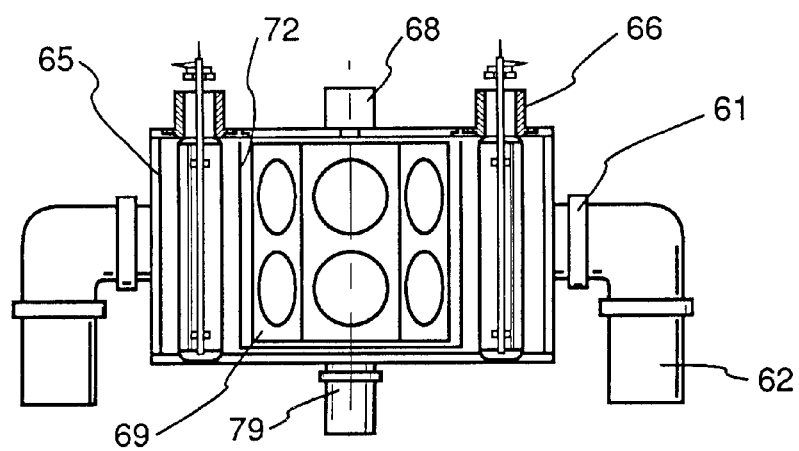
Figure 11:
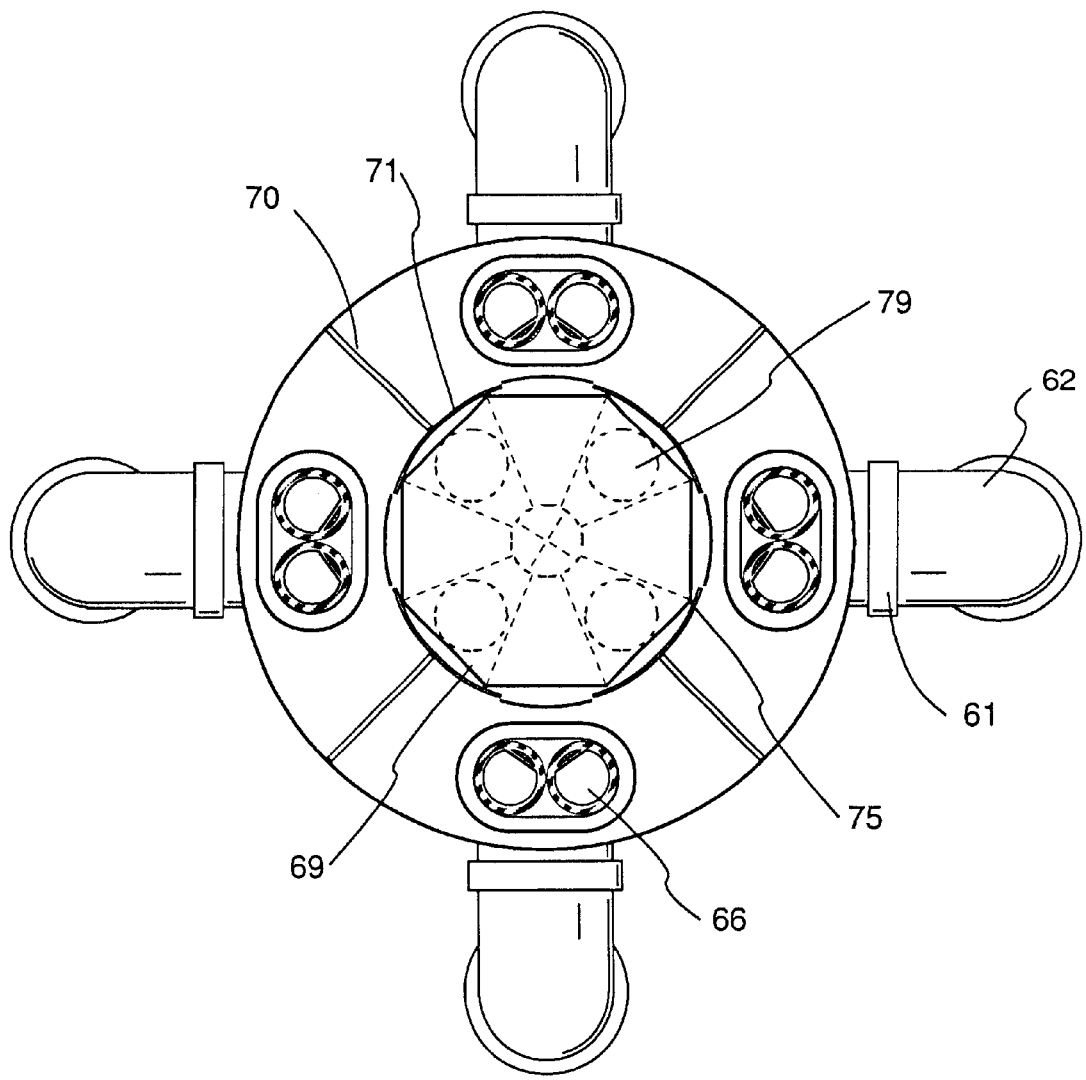
Figure 12:
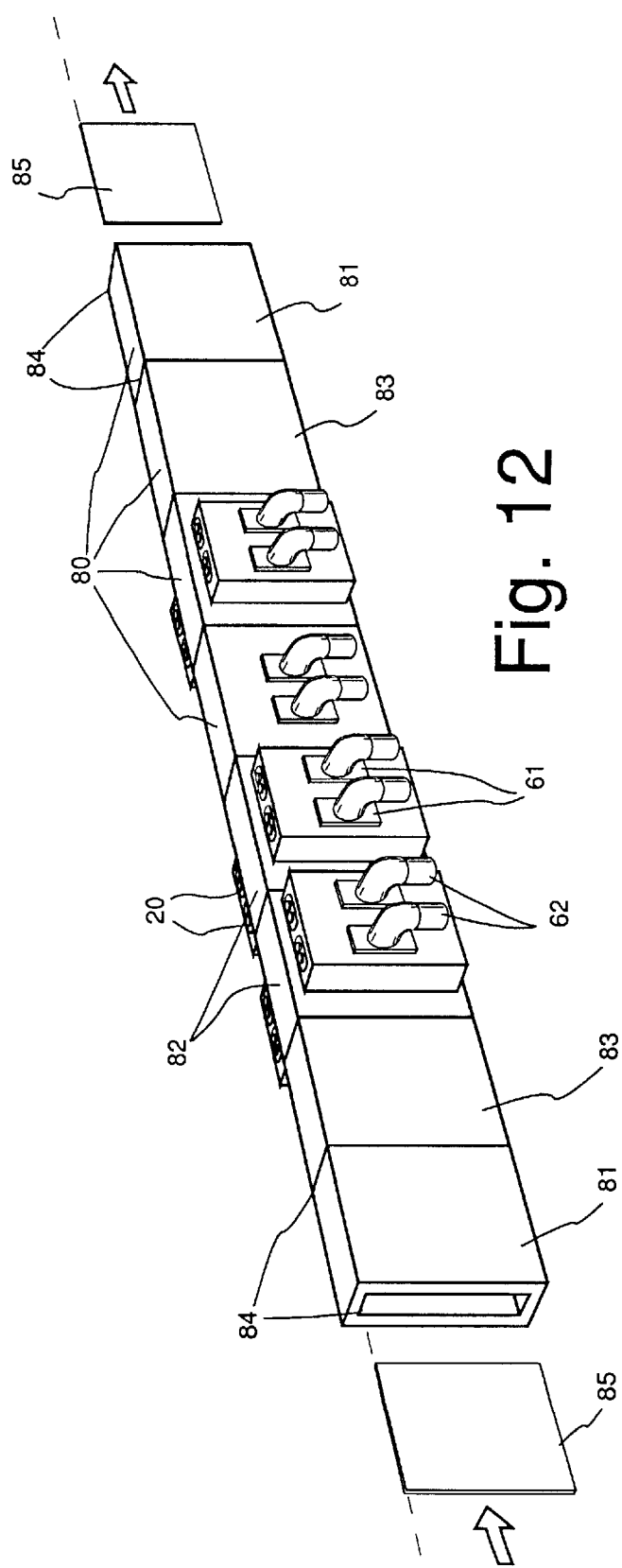
Figure 13:
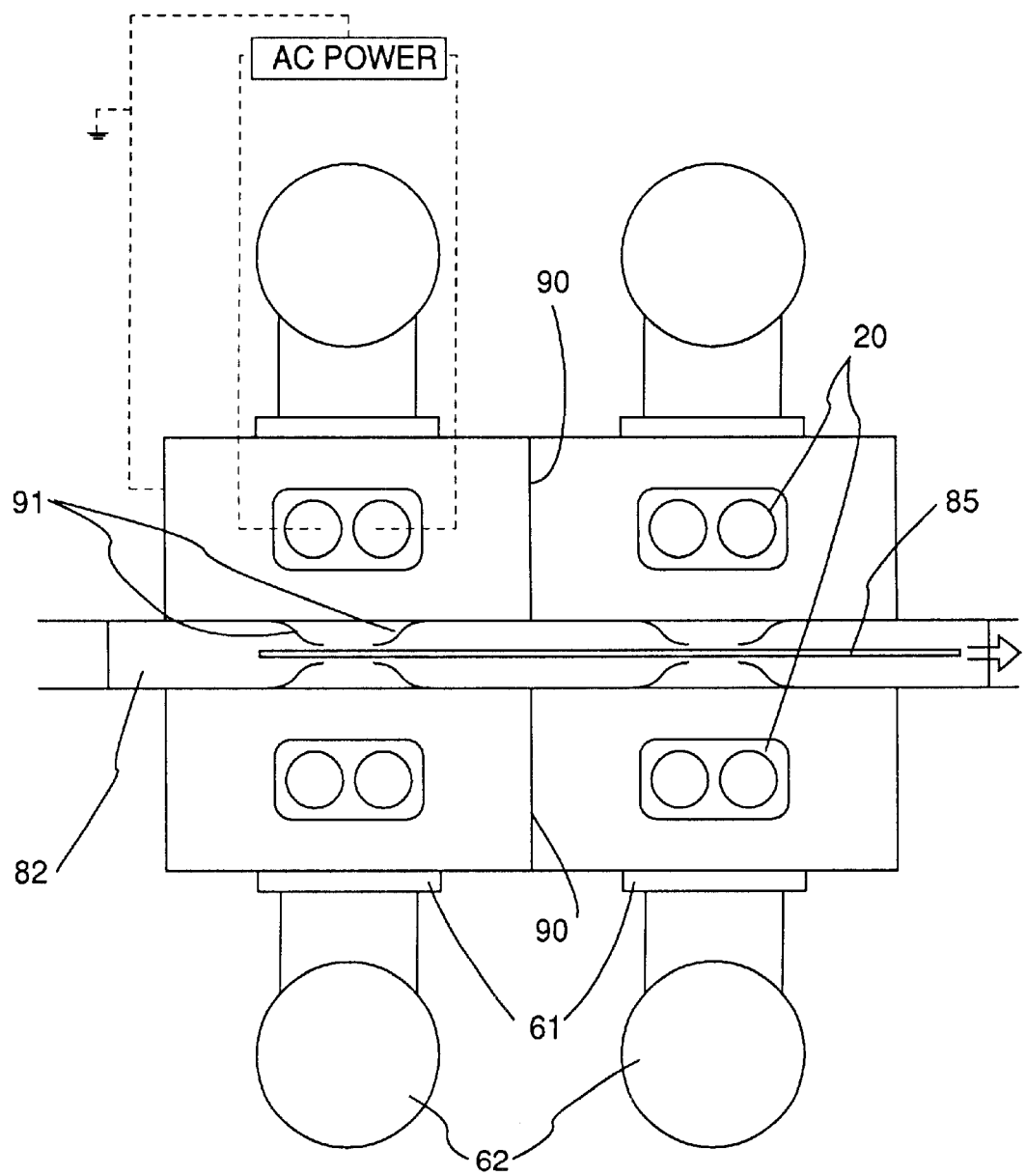

FIG. 4a shows a schematic diagram showing the Gaussian-like distribution of sputtered flux in the substrate plane from one of the narrow erosion zones on a rotatable cylindrical magnetron, W being the total width of the distribution at one half of the peak height, and a shield opening being indicated schematically which would isolate a relatively small but approximately constant deposition region around the peak;

FIG. 4b illustrates schematically the optimum flux distribution at the substrate plane from the double erosion zones of one rotatable cylindrical magnetron;

FIG. 4c shows a schematic diagram showing the optimum combination of flux distributions at the substrate plane for the distribution of FIG. 4b, the dashed lines corresponding to the flux distributions from one of the rotatable magnetrons and the solid lines corresponding to the flux distributions from the second rotatable magnetron, the shield opening indicated schematically isolating a wide and relatively uniform deposition zone;

FIG. 4d shows a schematic diagram showing an alternative optimum combination of flux distributions at the substrate plane, the dashed lines corresponding to the flux distributions from one of the rotatable magnetrons and the solid lines corresponding to the flux distributions from the second rotatable magnetron, the shield opening indicated schematically isolating a wide and relatively uniform deposition zone;

FIG. 5a shows a top planar view illustrating an embodiment of a basic sputtering module for use primarily in a batch coating machine;

FIG. 5b shows a top planar view illustrating an embodiment of a basic sputtering module for use primarily on an in-line machine;

FIG. 6 shows a plot of deposition rate vs. discharge voltage at different pressures for insulating aluminum oxide coatings using the process and control features of this invention;

FIG. 7 shows a three dimensional perspective view illustrating an embodiment of the apparatus useful for coating wafer-like substrates in a continuous circular mode;

FIG. 8a shows a top planar view of the embodiment of the apparatus shown in FIG. 7;

FIG. 8b shows a side planar view of the embodiment of the apparatus shown in FIG. 7;

FIGS. 9a, 9b, and 9c shows top planar views illustrating alternative embodiments of the apparatus using different shapes for the vacuum chambers;

FIG. 10a shows a top planar view of an embodiment of the apparatus illustrating gas isolation between two sets of dual rotatable cylindrical magnetrons;

FIG. 10b shows a side planar view of the embodiment shown in FIG. 10a;

FIG. 11 shows a top planar view illustrating an embodiment of the apparatus for gas isolation between four sets of dual rotatable cylindrical magnetrons;

FIG. 12 shows a three dimensional perspective view illustrating an in-line embodiment of the apparatus for coating relatively large flat substrates in a single pass; and FIG. 13 shows a top planar view of the deposition region of FIG. 12 showing details of the dual cylindrical magnetron sputtering modules.

DETAILED DESCRIPTION

Figure 2A:
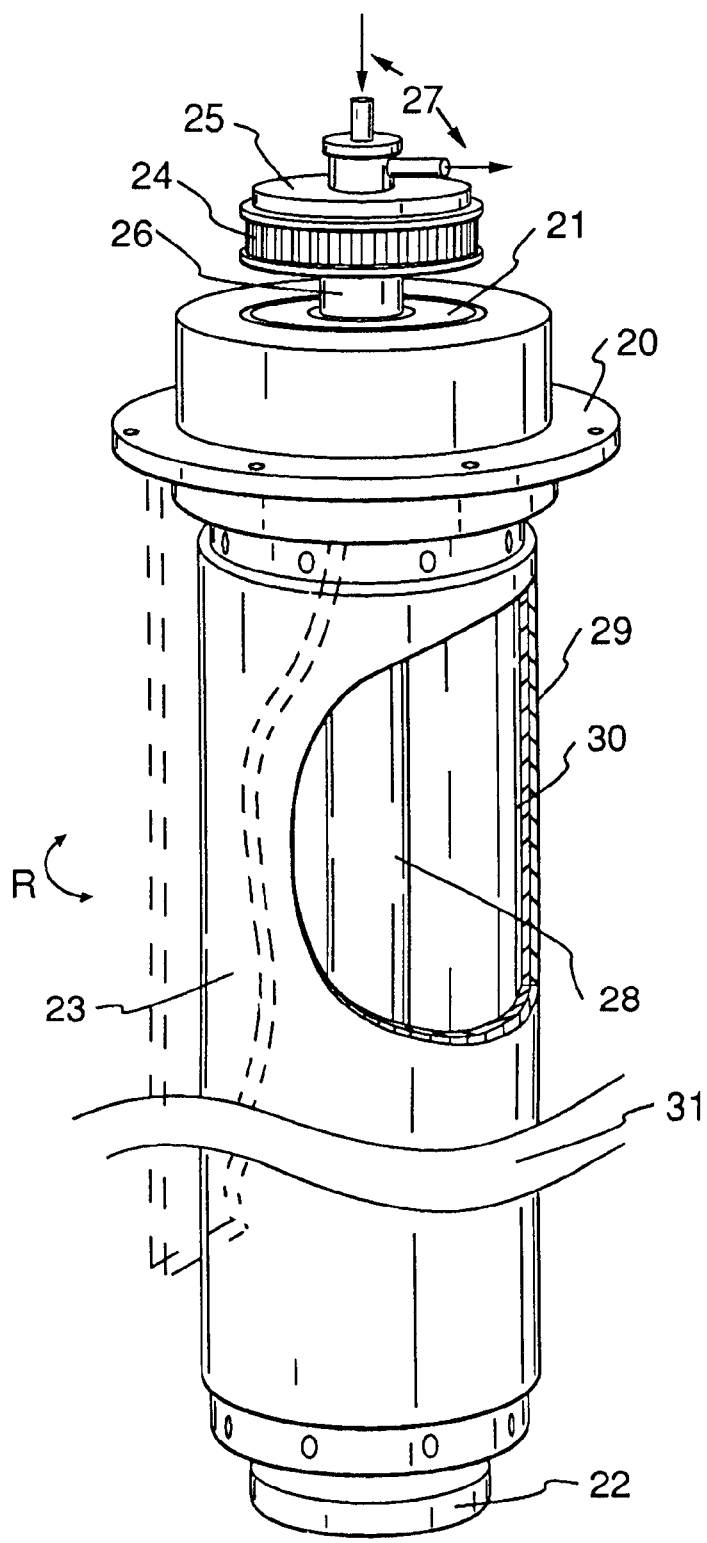
FIG. 2a shows a three dimensional perspective view illustrating one of the rotatable cylindrical magnetrons of a dual set or sets used in the various embodiments of the apparatus.

The improved dual cylindrical rotatable magnetron used in this invention consists of two similar individual magnetrons mounted together in parallel. Minor differences in dimensions or design details would not negate their ability to properly function together. FIG. 2a is a cutaway isometric view of a typical single cylindrical rotatable magnetron, which would be paired with a second one to form the dual version. The major parts of the device include electrically insulating mounting flange and collar 20, rotary vacuum feedthrough 21, insulating alignment flange 22, sputtering (or target) material 23, rotation receiving means 24 such as a pulley or gear, electrical commutator 25, target support tube 26, and cooling fluid (normally water) input and output 27. Secondary non-rotating tube 28 is concentric with tube 26 and supports the magnet assemblies (not shown) and provides a conduit for the cooling fluid. Mounting flange and collar 20 may be widened to incorporate the second magnetron of the dual set in the same structure. Depending upon its properties, tubular target material 23 may be machined from a relatively thick wall tube, or it may consist of tubular target material 29 bonded to a backing or carrier tube 30. For example, an aluminum or copper target may be machined from a single tube, whereas a carbon target must be bonded to a backing tube of a stronger material, for instance molybdenum or stainless steel. Both tubular target material 29 and backing tube 30 rotate (either direction as indicated by the heavy double headed arrow labeled R) while sputtering takes place. The magnetron may be as short as a foot to as long as several feet with the same basic cross-section as indicated by break 31 in the figure. Limits on length result from the strength of the materials used in construction, the diameter and thickness of the target tube, and the mounting orientation of the device. Vertical mounting is preferred both to minimize the gravitationally induced bending load on the target tube, which becomes heavy when filled with coolant, and to minimize debris contamination in the resulting coating.

Figure 1A:
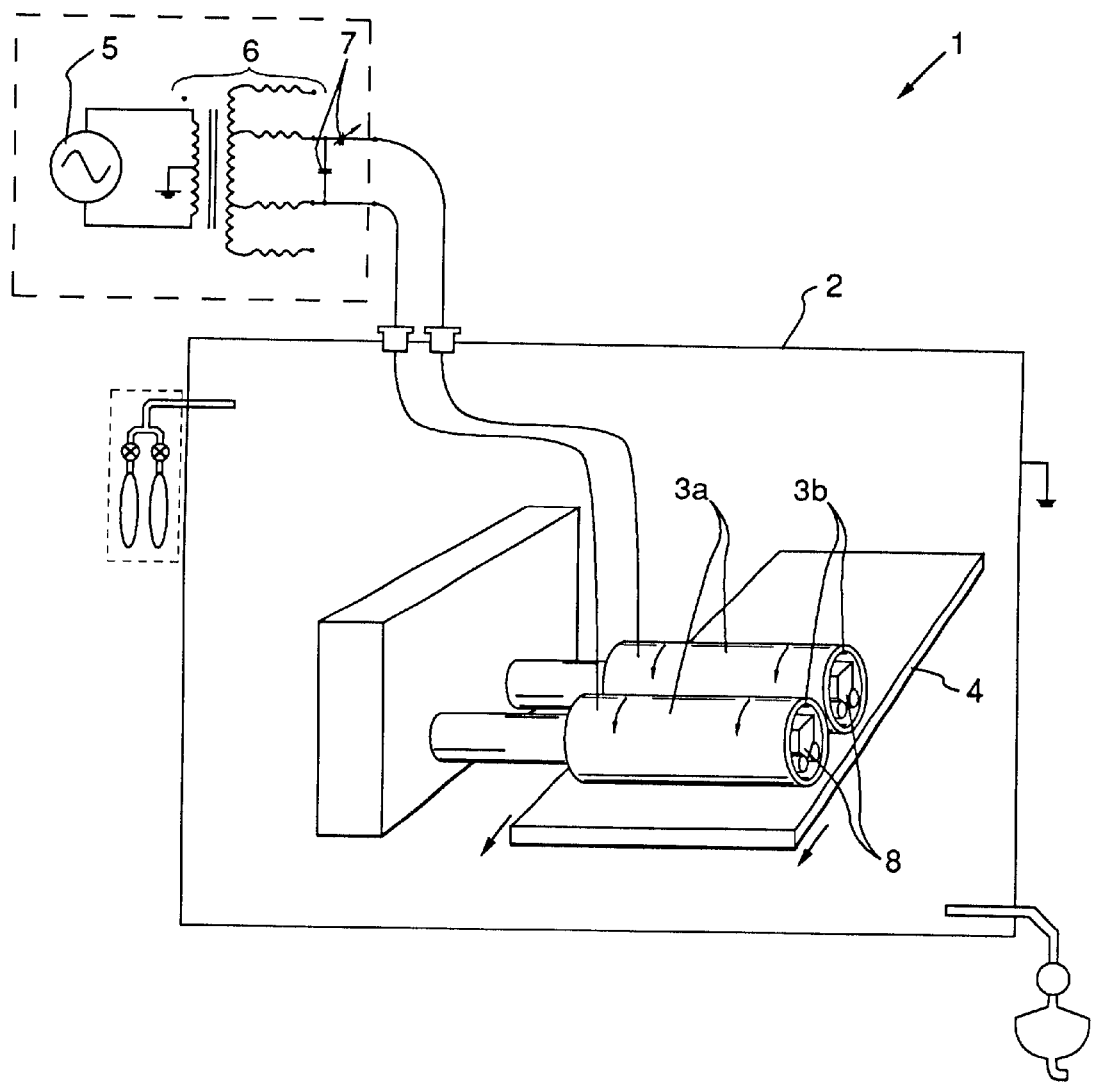
FIG. 1a shows a schematic diagram of a recent prior art sputtering system using an AC power supply.
Figure 1B:
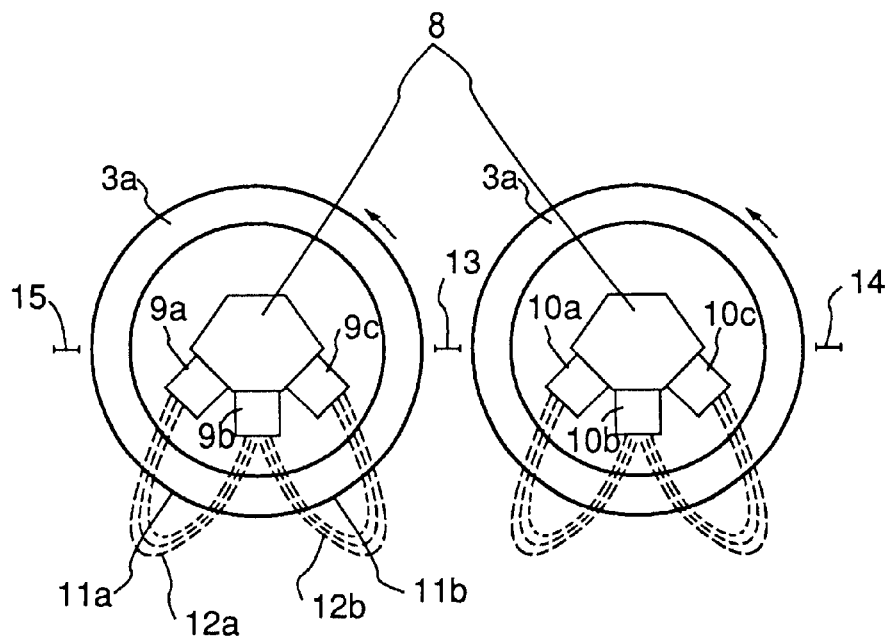
Figure 2B:
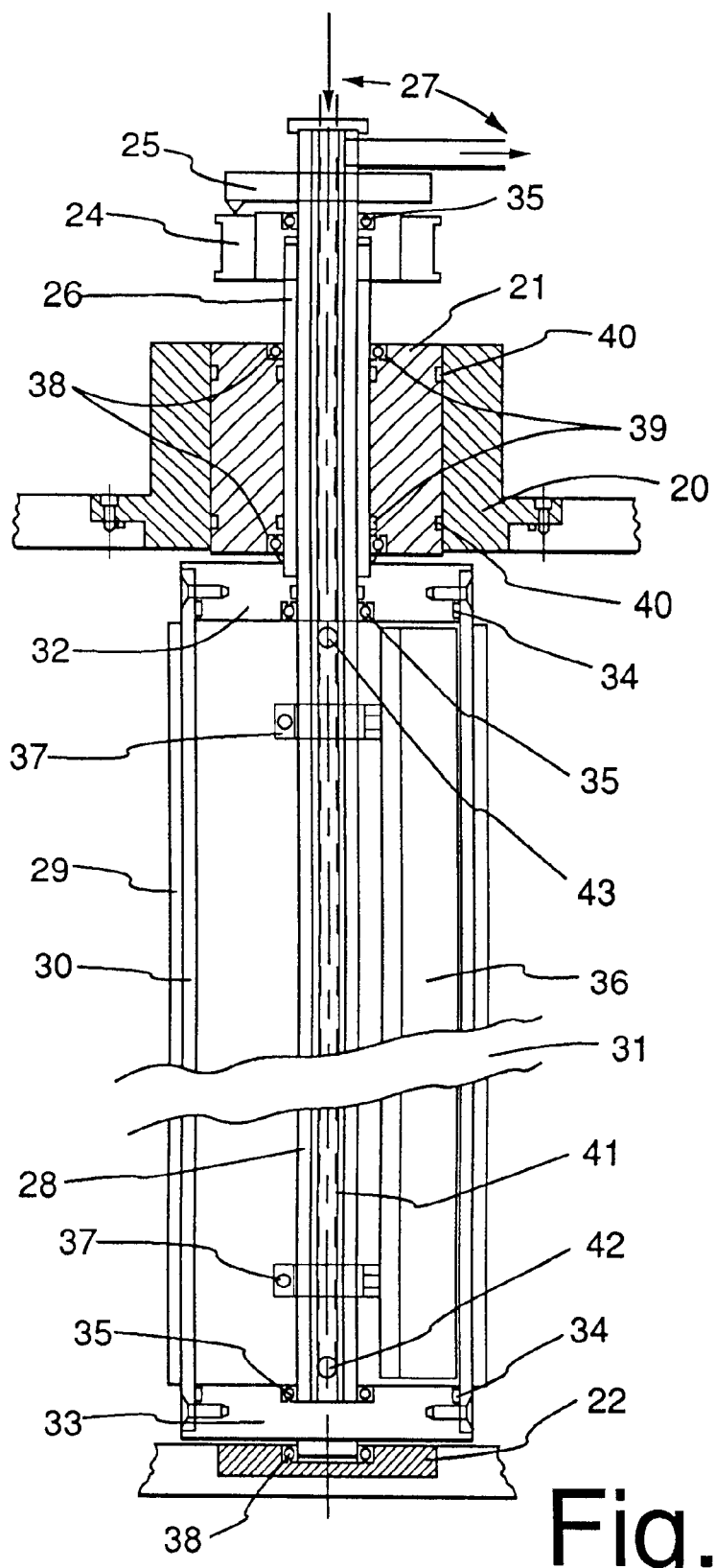
FIG. 2b shows a vertical cross sectional view illustrating the design and construction details of the rotatable cylindrical magnetron used in the apparatus.

Further details of the magnetron design are shown schematically in FIG. 2b, which is a cross-sectional view of FIG. 2a. Elements that are common to those shown in FIG. 2a are designated by the same numerals. Upper and lower tubular target supports 32 and 33 respectively are vacuum and water sealed by static O-rings 34. Target support tube 26 is permanently attached and sealed to tubular target support 32 (for example by welding) or alternatively, the part may be machined from a single piece of material. Three bearings 35 allow secondary tube 28 with electrical commutator 25, and magnet assembly or cage 36 along with support clamps 37 to remain fixed, while pulley 24, tube 26, target material 23 (FIG. 1a), and supports 32 and 33 rotate on bearings 38. While magnet assembly 36 normally would be held fixed with respect to a substrate position, this design will also permit an independent rotation or oscillation mode of the magnet assembly. This allows the sputtering erosion zones to be scanned across a stationary substrate in contrast to having the substrate pass by stationary sputtering erosion zones. The coating of magnetic memory disks is an example where this mode of operation may be useful.

In one embodiment, O-ring seals 39 may be used to provide dynamic vacuum sealing against rotating target support tube 26. In the preferred embodiment, feedthrough 21 including seals 39 would be replaced with the more reliable ferrofluidic type seals that are commercially available. In either embodiment feedthrough 21 is sealed to mounting flange by static O-ring seals 40. The water input/output arrangement 27 allows high flow rates to remove waste heat for high power operation (i.e. high deposition rate). It includes tube 41, which provides cold water input to the target housing through opening 42. An internal tube (not shown) connects opening 42 to another opening in the bottom of magnet assembly 36. Water then flows along the face of magnet assembly 36 and exits at the top. Water then returns to output 27 through hole 43 in tube 28 along the annular passage existing between tube 28 and tube 26. An important feature of this design is that there are no dynamic seals between the water and vacuum to cause reliability problems.

Figure 3A:
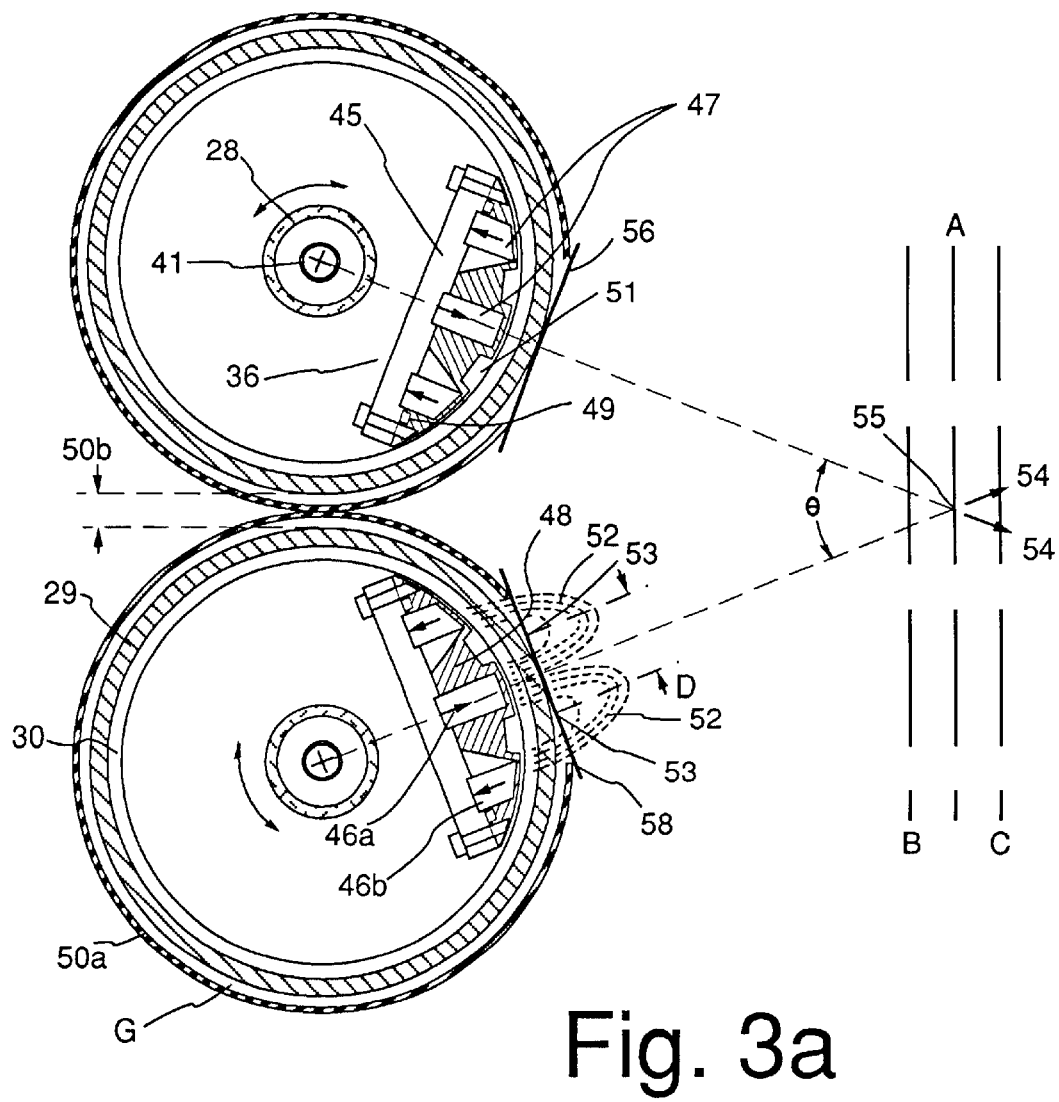
FIG. 3a shows a horizontal cross sectional view illustrating the design and construction details of the rotatable cylindrical magnetron used in the apparatus. The spacing, D, between the two erosion zones on each magnetron may be varied.

FIG. 3a shows a detailed cross-sectional schematic view of a set of cylindrical magnetrons, each of which was illustrated schematically in FIGS. 2a and 2b. The section is taken through the tubular targets to show the details of magnet assembly 36 of FIG. 2b. Elements common to those in the previous figures are labeled with the same numerals. Since the magnetron cross-sections are identical except for orientation, like elements are labeled only once. In conventional sputtering operations, magnet assemblies 36 are held fixed relative to the plane of the substrate, i.e., plane B or C in FIG. 3a. However, for some specialized coatings, magnet assemblies 36 may be rotated or "scanned" relative to the plane of the substrate in either direction as indicated by the double arrows in FIG. 3a. The magnet assemblies 36 may be scanned synchronized to each other or independently of each other. In one embodiment, magnet assemblies are mechanically linked to each other so that the scanning motion of each assembly is the same. In another embodiment, the magnet assemblies alternately scan over the substrate material. During scanning motion of a magnet assembly, the target continues to rotate with respect to both the magnet assembly and the substrate plane to improve target material utilization.

Each magnet assembly 36 consists of backing plate 45 constructed from a water resistant magnetic alloy, with center 46a and outer magnets 46b (arrows indicate direction of magnetization) and their associated magnet pole pieces 47. Pole pieces 47 aid in smoothing out the magnetic field produced by magnets 46a and 46b if they are constructed from an array of smaller individual magnets. Semi-circular, non-magnetic housing 48 is sealed to backing plate 45 by O-ring 49 to prevent corrosion of the magnets from exposure to coolant. The directions of magnetization of magnets 46a, 46b (indicated by arrows) may be reversed and the device will function equally well; however, all magnetron assemblies that are used in a given system usually have like magnetic orientation. Tubular targets 29 are surrounded by dark space shield 50a, which are open in the region of the plasma defined by the magnet assemblies. The gap G between dark space shield 50a and tubular target 29 is about 0.10 inches, a typical distance for sputtering at a pressure of a few millitorr. Shield 50a may be either electrically floating (as illustrated) or connected to system ground. It shields those regions of the tubular target surface which have been substantially cleaned by their passage past the sputtering region. Unlike the prior art taught in '195, these cleaned regions do not function as the anode or electrical return path during AC operation. The distance between the centers of the magnetrons is such that the surfaces of tubular targets 29 are separated by a distance 50b that is less than one inch and preferably about one-half inch. The distance 50b is much smaller than that taught in '195, but it is required to improve coupling between the magnetrons. Channels 51 in housing 48 help to direct coolant along the back of the heated erosion zones of the tubular target.

Magnets 46a and 46b are preferably of the rare earth (NdFeB) type, which have very high energy density. They produce arched magnetic fields 52, which define erosion zones 53 (one racetrack-type area). Magnet assembly 36 is intentionally constructed to minimize the distance between the center and outer magnets to produce narrow erosion zones with high magnetic field strength. In the figure the center magnets are shown twice as thick as the outer magnets to approximately balance the total north and south magnetic field energy. In order to optimize the distance, D (discussed later), between the parallel erosion zones, it may be necessary to separate the center magnets into two rows by a predetermined distance between them. In that case all the magnets should have the same thickness. This combination allows very high horizontal magnetic fields (more than 500 gauss) above target material 29 to enable low pressure, high power operation. Magnet assemblies 36 are oriented symmetrically toward each other. In FIG. 3a, source planes 56 and 58 are identified as containing the narrow erosion zones (approximating lines sources) and normal planes 54, perpendicular to the source planes and including the cylindrical axes of magnetrons, intersect at point 55 which typically is a few inches from the magnetrons. The included angle θ between the normal planes is less than 90° for most substrate positions.

Dashed line A passing through point 55 in FIG. 3a illustrates a possible position for the substrate plane. For the purposes of the present invention, the plane through point 55, as suggested by the prior art, is not the optimum substrate plane. The substrate planes indicated by dashed line B (closer to the magnetrons) and dashed line C (further from the magnetrons) are potentially more optimum positions, but the exact location is dependent upon the details of the geometry and construction of the device. The diameter of tubular targets 29, the spacing D between the erosion zones, and the position of the substrate are chosen to provide both a relatively uniform distribution and efficient utilization of sputtered flux at the substrate.

Figure 3B:
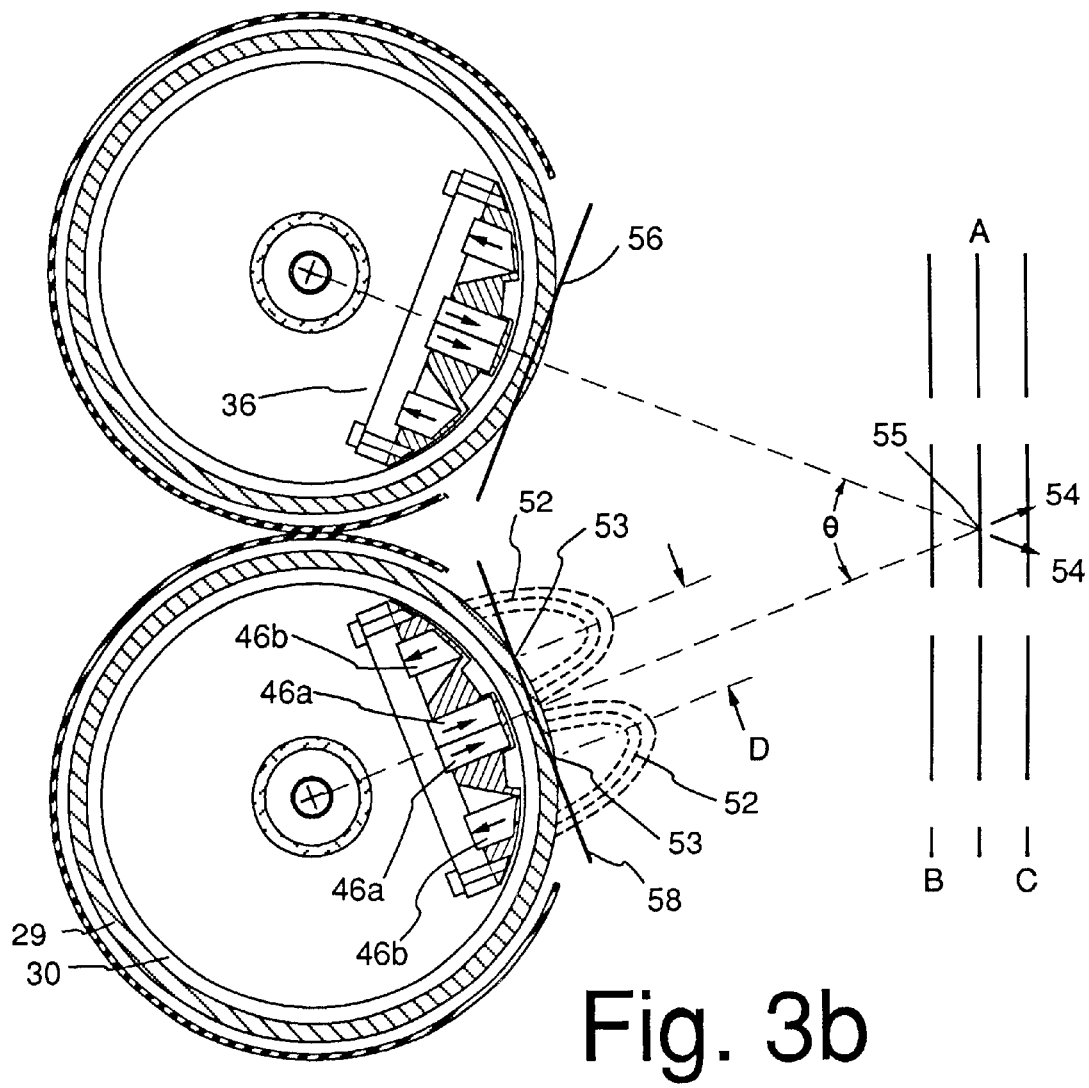
FIG. 3b shows a horizontal cross sectional view illustrating an alternative design for the magnet assembly which permits a variable distance between the narrow parallel erosion zones.

FIG. 3b illustrates schematically an alternate construction of magnet assembly 36 to increase the distance D between the erosion zones. In other respects FIG. 3b is similar to FIG. 3a with common elements labeled with the same numerals. As indicated in the figure, central magnets 46a consist of two rows instead of one, and outer magnets 46b are the same thickness as central magnets 46a. The width of each erosion zone 53 formed by fields 52 is about the same as those in FIG. 3a; however the width D between the erosion zones is increased by approximately the width of magnet 46a. The width D may be further increased by increasing the diameter of tubular target 29 and backing tube 30 and by widening magnet assembly 36. The spacing between central magnets 46a and outer magnets 46b would remain the approximately the same to keep fields 52 and erosion zone 53 unchanged, but the double row of magnets 46a would be spaced apart.

Figure 3C:
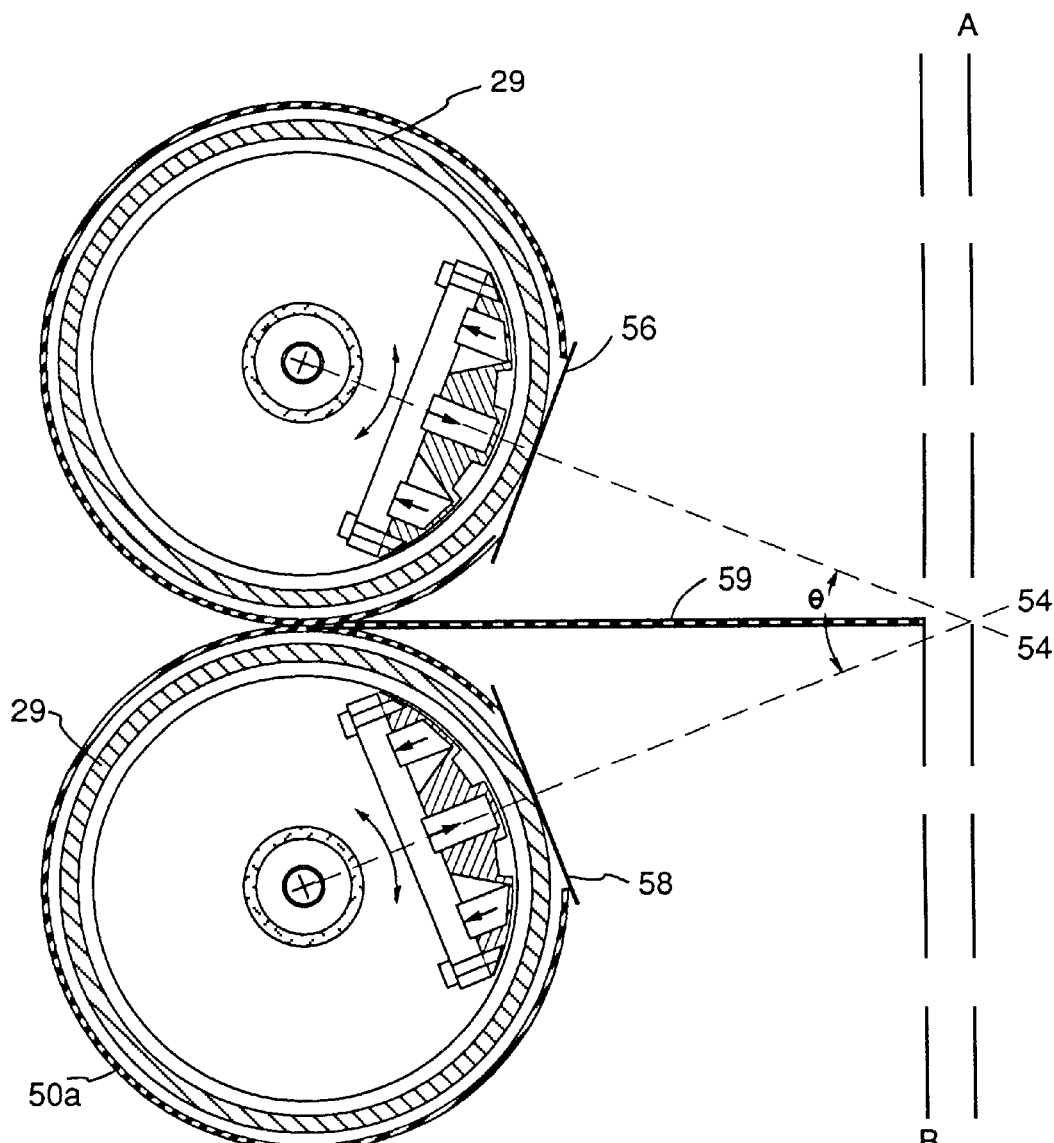
FIG. 3c shows a horizontal cross sectional view illustrating the use of the dual cylindrical magnetron for coating a second layer of material epitaxially over a different first layer of material.

FIG. 3c illustrates using the dual cylindrical magnetron to deposit two different materials, one over the other. FIG. 3c is similar to FIG. 3a except for a central baffle 59 that extends from dark space shield 50a approximately to substrate position B, and target materials 29 are different from each other. As a substrate is transported along position B, it is first coated with a first layer of material up to baffle 59, and then immediately coated with a second layer of material on the other side of baffle 59. This minimizes the exposure of the first layer to background contaminants, and allows the second layer of material to form epitaxially on top of the first layer. An example where this type of deposition is important is the coating of a magnetic memory layer over its base chromium layer. Epitaxial coating growth at the interface is critical for obtaining the correct properties in the magnetic memory layer.

In one version of the invention especially suited to coating stationary substrates with alternating layers of material, baffle 59 is shortened in length enough to allow the substrate to be exposed to each of the magnetron erosion zones. Also, openings in shield 50a at the source planes 56 and 58 are enlarged to allow each magnet assembly to be oscillated without the shield interfering with the erosion zones as they follow the movement of each magnet assembly. The result of this oscillation is that normal plane 54, representing the principal direction of the target flux, is passed back and forth across the stationary substrate. Each magnetron in this version is fired successively with DC power as the magnet assembly is oscillated to overcoat a first material with a second material. This process can be repeated a number of times to build up multiple layers of alternating materials. During the oscillation of the magnet assembly, the tubular target is rotated as in other versions of the invention to assure even consumption of the target material during the deposition process.

FIG. 4a illustrates schematically the relative distribution of sputtered flux from a single erosion zone on a plane perpendicular to normal plane 54 in FIG. 3a and located a few inches from the magnetron. The sputtered flux distribution has the approximate shape of a Gaussian curve. W indicates the width of the curve at one-half of the maximum flux. A shield opening near the substrate position is indicated through which a relatively uniform flux around the peak would reach the substrate. A constant partial pressure of reactive gas would yield a deposited film on the substrate that was substantially uniform in stoichiometry; however, the majority of the sputtered flux would not reach the substrate but be captured on the shield. This represents a very poor efficiency for the use of the available sputtered flux.

FIG. 4b illustrates a means of obtaining a large improvement in the utilization of the sputtered flux. Here the Gaussian-like flux distribution of the second sputtering erosion zone on the magnetron is added to the first, but it must be offset by about the half width W. This alignment of the two distributions yields a relatively broad and uniform flux distribution at the substrate (dotted line) as indicated by the much wider shield opening compared to that in FIG. 4a. The efficiency of flux usage is more than doubled. To achieve this result it is necessary for the separation of the sputtering erosion zones on the magnetron (D in FIG. 3a) to be approximately equal to the width W of the Gaussian-like curve. The most direct way to determine the correct geometry is by measurement of the deposition uniformity produced by a magnetron in which the parameter D can be readily varied.

After the individual magnetrons are designed and adjusted to produce the flux distribution shown in FIG. 4b, the layout for the dual version is completed by setting the included angle θ (in FIG. 3a) between the pair so that the centers of the distributions from each magnetron are twice the width W apart at the desired substrate position. FIG. 4c indicates this result schematically. The distribution from one magnetron is represented by the dashed curves, while that from the other is represented by the solid curves. The dotted curve shows the resulting flux distribution at the substrate with the relatively wide shield opening. The efficiency for uniform flux distribution in this arrangement is greater than 75% of the total flux available. For this arrangement to be possible, the substrate position must be near plane B or plane C in FIG. 3a. It can not be at plane A, where the normal planes 54 from the magnet assemblies intersect, without incurring a significant loss of efficiency or a reduction in uniformity of the film stoichiometry.

By using two rows of central magnets in the design as previously discussed, the distance D between the erosion zones (FIG. 3b) can be increased. At about twice the original distance (i.e. twice W), the two Gaussian-like distributions from the two erosion zones are separated by approximately twice the width of either distribution alone. The angle θ (FIG. 3b) may be adjusted by a small amount to again provide a flux distribution at the previous substrate position equivalent to that shown in FIG. 4c. FIG. 4d illustrates the uniform flux distribution attained in this way. The two dashed curves represent the distributions from one of the magnetrons, while the two solid curves represent the distributions from the other magnetron. Each distribution is symmetrical about normal plane 54 (FIG. 3b), and they are offset with respect to each other by width W. As in the previous example, efficiency is lost if the substrate is placed at plane A (in FIG. 3b).

For the epitaxial deposition of a second layer on a first different layer as illustrated in FIG. 3c, each magnetron would be set up to deposit the pattern shown in FIG. 4b. Angle θ (FIG. 3c) would be adjusted to place the edge of a shield opening (shown in FIG. 4b) at the edge of baffle 59 (FIG. 3c). This will give the maximum amount of uniform deposition on each side of baffle 59 and a high coating rate where the first coating terminates and the second epitaxially formed coating begins.

While this invention may be embodied in various forms, two basic examples of the sputtering apparatus (modules) are illustrated schematically in the top planar views of FIGS. 5a and 5b. They are basically identical in function, with the exception that the shape of walls and/or baffles 60a and 60b are adapted primarily for a circular array in the case of 60a, and for a linear array in the case of 60b. Each module is associated with vacuum valves 61 and pumps 62 which provide local pumping for atmospheric and sputtering gases within the enclosures defined by 60a and 60b. The enclosures may be formed by the walls of the vacuum chamber or may consist of baffles interior to a vacuum chamber. The dual rotatable cylindrical magnetrons are shown mounted on a common flange 20 with magnet assembly 36 angled toward each other and toward shield opening S, which allows sputtered flux to reach a substrate. The magnetrons are operated by AC power connected across the pair as indicated. The introduction of sputtering gas into the sputtering enclosure is not as sensitive to position in this invention as it is in much of the prior art. Gas injection (indicated schematically by the arrow labeled "Gas") through the rear wall is convenient. Inside the machine, the gas may be further routed via tubing (not shown) to positions between the magnetrons and shield opening S, and to one or both sides, for release along the length of the magnetrons. Baffling between the targets and the substrate with independent injection of the gas to separate the partial pressures of sputtering and reactive gas as practiced in the prior art is unnecessary. For safety reasons both the power supply case and the machine should be connected to a common ground.

The dual magnetrons will operate with any combination of steady and/or pulsed DC or AC electrical power; however, for the deposition of dielectric films, AC mode is preferred because it provides long term process stability and greatly reduced arcing. An additional benefit of AC power over DC power is that roughly half the flow of reactive gas is all that is required with AC power to obtain the same deposition rate and coating stoichiometry. The frequency of the AC supply is typically from ten to hundreds of kilohertz, depending upon the coating application. The low end is chosen to be faster than the plasma recombination time so that the plasma does not extinguish between alternate negative cycles of the AC power.

In principal, the sputtering process is stabilized and controlled by fixing a set of parameters for a particular coating. The important parameters consist of pumping speed, argon (i.e. sputtering) gas flow, reactive gas flow, and power supply voltage, all of which are simply held constant during deposition. Under these conditions, a small change in the control voltage level, with all other parameters remaining unchanged, results in a small but stable and repeatable change in film stoichiometry. This is strictly true only if the machine geometry is fixed in time, primarily meaning that the substrate is not moving during deposition. If the substrate is moving, or if any other changes in system geometry occur during deposition, then the pumping speed can change. In practice, pumping speed changes during substrate motion can be minimized by system design, as taught in this invention; however, they can not be totally eliminated. To compensate for the effect of substrate motion on pumping speed, the reactive gas flow is servo controlled to hold the total discharge power approximately constant at the same time that the power supply is operated at constant voltage. Alternatively, the servo control can hold current constant, which is equivalent to holding power constant since the voltage is fixed. This provides a fine tuning aspect for the control system, which is most beneficial when coating large substrates in a pass through system. It is not useful in DC mode, because arcs drive the reactive gas control loop into instability and oscillation.

The rotational speed of the magnetrons should be above a certain average threshold, which is determined by factors such as power level, reactive gas flow, and the plasma density in the erosion zone as previously discussed. It is best determined by experimentation, but in principle, it is selected so that only one or two monolayers of reactive product build up on the target during one rotation. Thicker layers lower the sputtering rate and increase the chances of arcing. In practice rotation rates between approximately 10 and 100 RPM are above the threshold depending upon the reactive properties of the material being sputtered. It is convenient to rotate each magnetron of a dual set at the same speed, but it is not a requirement.

As an example of the process control that can be achieved with this invention, the results for the deposition of aluminum oxide from a single pair of rotatable cylindrical magnetrons are presented graphically in FIG. 6. The plot shows the deposition rate for aluminum oxide films in units of Angstroms per second as a function of control voltage in percent of full scale. The total sputtering pressure ranged from 3 millitorr to 15 millitorr with the oxygen partial pressure being only a small percentage of the total pressure since the process substantially consumes it. At each voltage control point the oxygen flow was adjusted to keep the total power constant at 2 kilowatts per magnetron. The magnetrons were operated at a rotational rate of about 40 RPM; however, the process was stable over a range of rotational speeds. The films made at 3 millitorr and 50% voltage, and 6 millitorr and 47% voltage were slightly absorbing, while all of the others were optically clear. All were electrically insulating. As sputtering pressure increases, the films becomes stoichiometric (i.e. just clear) at proportionally lower voltages, essentially tracking the normal drop in plasma potential with increasing pressure. Competing methods for depositing aluminum oxide by RF diode and RF magnetron sputtering claim deposition rates of between 1 and 4 Angstroms per second, more than an order of magnitude less than the present invention.

FIG. 7 is a perspective view of a sputtering apparatus composed of the equivalent of six of the modules described in FIG. 5a. Elements common to those of previous figures are labeled with the same numerals. The apparatus consists of circular vacuum chamber 65 with sets of vertically mounted dual cylindrical rotatable magnetrons 66 mounted around the periphery. The sets of magnetrons are associated with vacuum valves 61 and pumps 62 placed on the outer circumference of chamber 65 and radially aligned with the magnetrons. The close association of a pump (or pumps) with each magnetron pair, along with internal shields and baffles (not visible), defines a relatively localized sputtering enclosure or module as shown in FIG. 5a. This arrangement minimizes changes in pumping speed during substrate motion, which is desirable for process control. A removable lid or flange 67 carries a substrate holder (not seen) which is rotated by motor 68. The diameter of vacuum chamber 65 may range from approximately two feet to several feet depending upon the coating application. This embodiment of the apparatus is useful for batch coating of wafer-like substrates used for thin film recording heads and integrated circuits. While the preferred embodiment has the magnetrons mounted vertically to minimize particulate contamination at the substrate, the machine would still function if the entire unit were mounted on its side (turned 90°) causing the magnetrons to be positioned horizontally.

A planar top view of the sputtering machine illustrated in FIG. 7 is shown schematically in FIG. 8a. For clarity, a planar vertical view of the same machine is given in FIG. 8b. Features common to those noted in FIGS. 5a and 7 are labeled with the same numerals in both figures. The machine comprises six of the basic sputtering modules described in FIG. 5a. Additional details include rotating substrate holder 69, which has six equal sides for mounting the substrates to be coated. However, it could take other shapes (octagonal, circular, etc.) so long as it can be rotated relative to the magnetrons during deposition as indicated by the curved arrow. It includes internal passages (not shown) for substrate cooling by a similar feed through mechanism as described for the rotatable magnetron in FIG. 2b. Holder 69, as depicted in FIG. 8b, is high enough to accommodate two rows of round substrates; however, the height of the machine may be shorter or longer than shown to coat a different number of rows of substrates. Internal, symmetrically positioned, vertical panels or baffles 70 provide semi-isolation of the common sputtering gas partial pressure between pairs of magnetrons. They define the walls between the six basic sputtering modules. This degree of isolation is adequate to allow independent process control. Additionally, panels 70 may be engineered to provide extra support against deflection of the top and bottom plates of the machine when they are under load from the vacuum. This allows construction with thinner materials to help reduce the overall weight of the machine.

Symmetrically placed curved panels 71 form shields, which are a part of the shutter system for control of the sputtered flux. They should be removable for cleaning and may or may not be rigidly attached to panels 70. Six symmetrical panels 72 form a rotatable shutter, which is closed (position illustrated) for target startup and stabilization, and later opened for the coating operation. This shutter may be formed by cutting six symmetrical openings out of a thin wall cylinder. The openings correspond in shape to the openings between fixed panels 71. Rotating the shutter cylinder 30° from the indicated closed position aligns shutter panels 72 radially with fixed panels 71, thus opening the shutter to allow the sputtered flux to reach the substrates. Rotatable shutter 72 may be placed interior to the circle formed by shield panels 71 as illustrated, or it may be placed exterior to the circle formed by shield panels 71 for embodiments in which it would not interfere with baffles 70 when opened. Shutter cylinder 72 is rotated by actuator or motor 73 (FIG. 8b). The substrate location and the shield openings between panels 71 correspond to the previously discussed geometrical requirements for producing a uniform and highly efficient flux distribution at the substrate position.

Sputtering gas (usually argon) and the reactive gas is preferably introduced near each set of dual magnetrons 66 as described in FIG. 5a. Because of the rotation of the substrates past the magnetron sources, and because of the symmetrical geometry of the apparatus, each substrate receives sputtered flux at angles from 90° to its surface to less than 45°. In this way step coverage is achieved over substrate topology while the system is operated at low sputtering pressure, high power, and high deposition rates. Such high energy, reactive magnetron coatings at high deposition rates, and with good step coverage have not been possible with prior art equipment and processes.

Acceptable variations in the machine design include but are not limited to the number of dual magnetron sputtering sources and the shape of the vacuum chamber. FIG. 9a shows a top planar view of a machine with only four sets of dual rotary cylindrical magnetrons and their associated basic sputtering modules. In all other aspects it is practically identical to the machine in FIG. 8a in both form and function. The vacuum chamber need not be circular, although circular is preferred. FIGS. 9b and 9c illustrate alternative polygonal forms (octagonal and square respectively) for the vacuum chamber in the case of four pairs of magnetrons. Other shapes would be appropriate for machines with different numbers of magnetron pairs. For a particular coating application the number of magnetron pairs, chamber shape, shield widths, substrate holder shape, etc. are chosen to meet the specific requirements of the coating, which could include very high net deposition rates, special step height coverage, and tight control of stoichiometry.

Other coating requirements could place more stringent demands on the process than those considered previously. For example, it may be necessary to coat a substrate with alternating layers of different materials, such as an oxide and a nitride. In this case, process isolation and control would require better physical separation of the different coating regions of the machine to isolate the oxygen that is injected near one set of magnetrons from the nitrogen that is injected near another set. FIGS. 10a and 10b illustrate planar top and side views of an embodiment of the machine design which provides improved separation for different process gases. Elements, which are common to those shown in FIGS. 7, 8a, and 8b, are designated by the same numerals. FIG. 10a shows the modifications necessary to provide for process isolation. These include placing curved panels 71 in close proximity to substrate holder 69 in such a manner that corners 75 of holder 69 form dynamic seals by maintaining a closely spaced but non-contact relationship to curved panels 71. Panels 70 still provide barriers between curved shield panels 71 and the outer walls of the machine, and they should fit tightly against the top and bottom of the machine as in the previous examples. Substrate holder 69 should have enough corners so that at least one seal 75 always exists along any path from one process region to any other. While substrate holder 69 rotates during the process, a volume 76 is formed which can trap process gases at one deposition module and transport them to another. In addition, if the height of substrate holder 69 is less than the internal height of the main vacuum chamber, openings will exist along the top or bottom or both that will permit the undesired mixing of process gases. To prevent this mixing of gases, vanes 77 attach to a central circular vane 78 (at the top and bottom of substrate holder 69) to form top and bottom dynamic barriers. Additionally, these vane structures form trapped volumes which connect to volumes 76. As the holder rotates these trapped volumes are evacuated by a set of pumps 79 (for example turbo-pumps) which prevent cross contamination of the gases.

The design concept described above is useful not only for coatings with alternating layers of different materials, but also for coating of the same materials if the system characteristics make process control more difficult by increasing the degree of cross talk between modules. This condition can occur if the pumping speed is reduced enough that the chemical pumping caused by the process (i.e. gettering) is a sizable fraction of the available system pumping speed. In some systems this could occur if the deposition rate were increased without concurrent increases in pumping speed, or if for some reason the pumps were restricted by other structures.

The above example for coating alternating layers of different materials, or for improved process control was shown for a system with two pumps and two dual rotatable magnetron sources (i.e. two basic modules). However, the concept is extendible to larger numbers of pumps and sources. FIG. 11 shows a top planar view of an example of the design for four pumps and four dual rotatable magnetron sources (four basic modules). To maintain proper process gas separation, substrate holder 69 has been modified to have eight sides instead of the previous six, so that at least one of the seals formed by corners 75 are always actively engaging panels 71 during process. In addition, more trapped volumes exist which must be evacuated by four pumps 79 instead of the previous two.

FIG. 12 illustrates a conceptual design of a second embodiment of the apparatus for coating relatively large flat substrates in an in line pass through mode. The coating machine is shown as an assemblage of individual chambers 80 which, with appropriate modifications, function as load lock and unload lock chambers 81, deposition chambers 82, and auxiliary chambers 83 that are used for other process steps (examples include heating, etching, and annealing). When chambers 83 are positioned between deposition chambers 82, they become buffer chambers with additional pumps for process separation. With the exception of the load and unload chambers 81, the remainder of the machine alternately could consist of a single long chamber with appropriate internal divisions to separate the functions. At a minimum the machine must have vacuum isolation valves or doors 84 on each end of load and unload chambers 81 for passing substrates from air to vacuum for processing and finally back to air. Relatively large flat substrates 85, with dimensions of up to several feet, are made to pass through the machine by a mechanical or magnetic levitation transport mechanism (not seen in the figure). Deposition chambers 82 are fitted on each side with pairs of vertically mounted dual rotatable cylindrical magnetrons 20, and their associated vacuum valves 61 and pumps 62, which are appropriate linear arrays of the sputtering modules shown in FIG. 5*b*. Although the machine is illustrated with two pairs of dual rotatable magnetrons (i.e. two modules) per side on an individual deposition chamber 82, single modules or more than two modules are also acceptable embodiments.

FIG. 13 is an enlarged, more detailed, planar top view of a deposition process chamber 82 of FIG. 12. Elements in FIG. 13, which correspond to elements previously labeled in FIG. 12, are given the same numerals. The deposition process chamber comprises the equivalent of four of the basic sputtering modules described in FIG. 5*b* attached to chamber 82 which contains a section of the substrate transport mechanism. The dual rotatable cylindrical magnetrons 20 are indicated as being mounted on a common flange as before. Although this is not necessary, it is convenient for removal and maintenance, as well as for holding accurate alignment between the magnetrons. An AC power source is connected across each pair of magnetrons with the safety ground as indicated before in FIG. 5*b*. In this embodiment internal panels 90 provide semi-isolation of the gas environment between pairs of dual magnetrons to form a pair of basic sputtering modules. Alternatively, panels 90 could be constructed as separate vacuum walls, allowing each set of magnetron modules to become independently mountable units. Shields 91 are designed and installed to meet the requirements (previously explained) for a highly uniform flux distribution at substrate 85 as it passes by (indicated by the arrow) the deposition sources. Any mixing of sputtering gas or process cross talk between the process control systems of the sputtering modules is limited to that which may occur as a result of the openings in shields 91.

If the coating is of only one type, an oxide for example, the four sets of modules as shown in FIG. 13 can be independently controlled, and any number of similar modules may be linked directly together. However, if an oxide coating is to be followed with a nitride (or other unmatched reactive) coating, then the nitride modules should not directly follow the oxide modules. A buffer chamber, as shown in FIG. 12, containing its own vacuum pumps and partial pressure separating baffles would have to be placed between the oxide and nitride process modules to prevent cross contamination and allow the controls to operate independently.

Although the present invention has been described in considerable detail with reference to certain preferred versions thereof, other versions are possible. Therefore, the spirit and scope of the appended claims should not be limited to the description of the preferred versions contained herein.

What is claimed is:

1. A magnetron system for eroding and depositing target material on a substrate, comprising:
   a first and a second cylindrical tubular target, each having a longitudinal axis and an outside surface and a fixed length, each cylindrical tubular target rotatable about the longitudinal axis of the cylindrical tubular target, wherein the second rotatable cylindrical tubular target is positioned relative to the first target such that axes of the first and second targets are parallel to each other and the outside surfaces of the first and second cylindrical tubular targets are in close proximity; and
   a first and a second magnetic assembly respectively disposed within and along the length of the first and the second tubular target, each magnetic assembly configured to provide a magnetic field racetrack over the outer surface of each tubular target, the magnetic field racetrack confining a plasma gas to erode the target material of each target from a pair of substantially parallel erosion zones along the length of the each tubular target, each pair of erosion zones defining a source plane for each target and being separated by a distance therebetween, and each magnetic assembly configured to fix the distance between the parallel erosion zones in each target to create a combined area of target material flux for each tubular target,
   wherein a greater fraction of the target flux from each target is utilized to deposit target material on the substrate than from a single zone on each target, and
   wherein the magnetic assemblies are oriented relative to each other such that, at the substrate, an included angle is formed between a pair of planes, normal to the source planes and passing through the axis of each target, and the target flux of each of the targets combines to create an area of substantially uniform flux at the substrate.

2. A magnetron assembly as recited in claim 1, wherein the tubular target includes
   a target support assembly for holding the target material and for enabling the target material to be rotated with respect to the magnet assembly.

3. A magnetron assembly as recited in claim 2,
   wherein each tubular target rotates at a determinable speed and the plasma gas has a determinable density; and
   wherein the speed of rotation and the density of the plasma gas at the erosion zones substantially prevent target material from accumulating on the target at a location away from the erosion zones during a rotation of the tubular target.

4. A magnetron assembly as recited in claim 2,
   wherein each tubular target rotates at a determinable speed; and
   wherein the speed of rotation is in a range of about 10 to 100 RPM.

5. A magnetron assembly as recited in claim 1, further comprising:
   a first ungrounded electrode in electrical contact with the first tubular target and
   a second ungrounded electrode in electrical contact with the second tubular target; and
   wherein the first electrode receives electric power from a first pole of an ac electric source and the second electrode receives electric power from a second pole of the ac electric source, and
   wherein the first and second tubular targets alternately become active and inactive to deposit target material on the substrate as the poles of the ac electric source alternate in polarity, the inactive target and the plasma providing a low and substantially constant electrical resistance return path back to the ac electric source.

6. A magnetron assembly as recited in claim 5, wherein:
the first tubular target becomes active to deposit target material on the substrate when the first pole of the ac electric source is negative with respect to the second pole; and
the second tubular target becomes active to deposit target material on the substrate when the second pole of the ac electric source is negative with respect to the first pole.

7. A magnetron assembly as recited in claim 5,
wherein the ac source provides an rms voltage to the first and second ungrounded electrodes; and
wherein the rms voltage provided by the ac source is substantially constant.

8. A magnetron assembly as recited in claim 1, wherein the outside surfaces of the tubular targets are separated by a distance in a range of about one-half inch to one inch.

9. A magnetron assembly as recited in claim 1, wherein the two planes normal to the source planes intersect in a line common to both planes; and
wherein the substrate is positioned at a distance proximate to, but not at, the intersecting line of the two planes normal to the source planes.

10. A magnetron assembly as recited in claim 9, wherein the substrate is positioned at a distance nearer to the targets than the intersecting line.

11. A magnetron assembly as recited in claim 9, wherein the substrate is positioned at a distance farther from the targets than the intersecting line.

12. A magnetron assembly as recited in claim 9, wherein the intersecting line is a few inches from the tubular targets.

13. A magnetron assembly as recited in claim 1,
wherein the target flux has a determinable distribution at the substrate; and
wherein the target flux at the source plane from a single erosion zone has a distribution of a Gaussian-like curve having a center of distribution and a width, the width of the Gaussian-like curve being a distance between two one-half points on the curve.

14. A magnetron assembly as recited in claim 13, wherein the distance between the parallel erosion zones on each target is approximately equal to the width of the Gaussian-like curve for a single erosion zone, the target flux at the substrate from the pair of erosion zones being substantially uniform over a field larger than that from a single erosion zone and having a center of distribution at a point where the Gaussian-like curves for the zones intersect.

15. A magnetron assembly as recited in claim 14,
wherein the included angle between the normal planes of the first and second targets is such that the center of the distributions from each target are separated by twice the width of a single Gaussian-like curve at the substrate such that there is a substantially uniform field of target flux from both targets, and
wherein the field from the pair of targets includes a substantial fraction of the flux from both targets.

16. A magnetron assembly as recited in claim 15, wherein the field from the pair of targets includes about 75% of the flux from both targets.

17. A magnetron assembly as recited in claim 13, wherein the distance between the parallel erosion zones on each target is approximately twice the width of the Gaussian curve for a single erosion zone, the target flux at the substrate from the pair of erosion zones having a center of distribution at a point where the Gaussian curves for the erosion zones intersect.

18. A magnetron assembly as recited in claim 17,
wherein the included angle between the normal planes of the first and second targets is such that the centers of distribution from each target are separated by the width of a single Gaussian-like curve at the substrate such that there is a substantially uniform field of target flux from both targets, and
wherein the field from the pair of targets includes a substantial fraction of the flux from both targets.

19. A magnetron assembly as recited in claim 18, wherein the field from the pair of targets includes about 75% of the flux from both targets.

20. A magnetron system for eroding and depositing target materials on a substrate, comprising:
a first and a second cylindrical tubular target, each having a longitudinal axis and an outside surface and a fixed length, the first target composed of a material and the second target composed of a material that are different from each other, each tubular target rotatable about the longitudinal axis of the cylindrical target, wherein the second rotatable cylindrical tubular target is positioned relative to the first target such that axes of the first and second targets are parallel to each other and the surfaces of the first and second cylindrical tubular targets are in close proximity;
a first and a second magnetic assembly respectively disposed within and along the length of the first and the second tubular target,
each magnetic assembly configured to provide a magnetic field racetrack over an outer surface of each tubular target, the magnetic field racetrack confining a plasma gas to erode the material of each target from a pair of substantially parallel erosion zones along the length of the each tubular target, each pair of erosion zones defining a source plane for each target and being separated by a distance therebetween,
each magnetic assembly configured to fix the distance between the erosion zones in each target to combine the flux from each zone so as to create an area at the substrate of substantially uniform target flux for each tubular target,
wherein a greater fraction of the target flux from each target is utilized to deposit target material on the substrate than from a single erosion zone on each target; and
a baffle disposed between the tubular targets and separating the areas of target flux from each target at the substrate such that the substrate receives first target material to form a first layer on the substrate and then receives second target material to form a second layer over the first layer on the substrate as the substrate is moved past the area of target flux from each target.

21. A method of operating a sputtering process to deposit material from a pair of targets onto a stationary substrate to achieve a given coating stoichiometry, the method comprising the steps of:
introducing a flow of sputtering gas into an evacuated chamber in which the substrate and target material reside;
introducing a flow of reactive gas into the evacuated chamber to cause the deposition of a combination of the target material and the reactive gas onto the substrate, the sputtering gas and reactive gas being pumped into the chamber at a specified speed;

connecting each target material to a voltage source that provides a voltage to cause sputtering gas ions to erode each target material;

forming an intense magnetic field over each target material to confine the sputtering gas ions over a pair of substantially parallel erosion zones on each target material, target material from the erosion zones combining to create an area of substantially uniform target material flux at the substrate, maintaining the sputtering gas flow, the voltage and the pumping speed approximately constant; and scanning the magnetic field synchronously over each target material to sweep the target material flux from each target across the substrate.

22. A magnetron for eroding a target and depositing target material onto a substrate, comprising:

a cylindrical tubular target having a longitudinal axis, an inside surface and outside surface and a fixed length, the inside and outside surfaces having a certain inner and outer circumference, respectively, said target being rotatable about said longitudinal axis, said tubular target including a target material supporting assembly having:
  a target support tube;
  a cylindrical target backing tube for holding the tubular target material;
  first and second target backing tube supports, one at each end of the cylindrical target backing tube, the first tube support for holding the target backing tube in place over and coaxial with the target support tube, a cylindrical chamber being formed by the target backing tube and the target backing tube supports; and
  means for receiving rotational drive to rotate target material supporting assembly; and a magnetic assembly, disposed within and along the length the cylindrical tubular target, configured to provide a magnetic field racetrack over the outside surface of the tubular target, the magnetic field racetrack confining a plasma gas to erode the target material from a pair of substantially parallel erosion zones extending along the length of the tubular target, said assembly being configured to fix the distance between the erosion zones to create an area of substantially uniform target material flux at the substrate, wherein a greater fraction of the target flux is utilized to deposit target material uniformly on the substrate than with a single erosion zone.

23. A magnetron as recited in claim 22, further comprising an electrode in electrical contact with the tubular target, wherein the electrode receives power from an external power source to charge the target at a potential sufficient for deposition of the target material onto the substrate.

24. A magnetron as recited in claim 22, wherein means for receiving rotational drive is a pulley.

25. A magnetron as recited in claim 22, wherein means for receiving rotational drive is a gear.

26. A magnetron as recited in claim 25, further comprising:

a secondary tube fitted within the target support tube and extending from the second tube backing support through the backing tube and through the target support tube; and an electric commutator mounted on the secondary tube, in electrical contact with the secondary tube to provide a charge sufficient for the target material to act as a cathode during the depositing of the target material onto the substrate.

27. A magnetron as recited in claim 26, wherein the magnet assembly is mounted to the secondary tube.

28. A magnetron as recited in claim 26, further comprising a coolant tube having a first end near the second backing tube support and a second end, fitted within the secondary tube, the coolant tube having an input orifice near the first end of the cooling tube for receiving an injected coolant, and wherein the coolant is ejected from an output orifice of the coolant tube near second end.

29. A magnetron as recited in claim 28, wherein the magnet assembly is mounted to the secondary tube; and wherein the magnet assembly is cooled by from the coolant tube.

30. A magnetron for eroding a target and depositing target material onto a substrate, comprising:

a cylindrical tubular target having a longitudinal axis, an inside surface and outside surface and a fixed length, the inside and outside surfaces having a certain inner and outer circumference, respectively, said target being rotatable about said longitudinal axis;

a magnetic assembly, disposed within and along the length the cylindrical tubular target, configured to provide a magnetic field racetrack over the outside surface of the tubular target, the magnetic field racetrack confining a plasma gas to erode the target material from a pair of substantially parallel erosion zones extending along the length of the tubular target, said assembly being configured to fix the distance between the erosion zones to create an area of substantially uniform target material flux at the substrate, wherein a greater fraction of the target flux is utilized to deposit target material uniformly on the substrate than with a single erosion zone, said magnetic assembly including a backing plate constructed from a magnetic alloy;

a semi-circular non-magnetic housing having a curved portion fitted within a portion of the inner circumference of the tubular target, resting on and sealed to the backing plate and defining a plurality of magnet cavities between the housing and the backing plate, a plurality of cooling cavities formed between the inside surface of the tubular target and the curved portion of the housing;

a plurality of magnets disposed within the cavities for creating the magnetic field over the target material; and a dark space shield having a tubular shape and fitted over the tubular targets, a gap of a fixed size existing between the shield and the tubular target, the shield having an opening for exposing the tubular target to the plasma gas to define the erosion zone of the tubular target subject to erosion by the plasma gas.

31. A magnetron as recited in claim 30, wherein the magnets are fabricated from a rare earth material having a very high energy density.

32. A magnetron as recited in claim 31, wherein the rare earth material is NeFeB.

33. A magnetron as recited in claim 30, wherein each magnet of the plurality of magnets includes an array of individual smaller magnets and wherein each magnet has a pole piece to smooth out the magnetic field produced from the array.

34. A magnetron as recited in claim 30, wherein the plurality of magnets comprises a center group and two outside groups that are spaced a certain distance from the center group, each outside group and the center group having a certain polarity so as to define a pair of magnetic arches each spanning the distance between the center and outside groups over the tubular target, an apex of each of the pair of magnetic arches separated by a certain spacing, which is defined by the distances between the magnet groups.

35. A magnetron as recited in claim 30, wherein the plurality of magnets comprises two center groups and two outside groups, each outside group adjacent to a center group and spaced a certain distance therefrom, each outside group and its adjacent center group having a certain polarity so as to define a pair of magnetic arches each spanning the distance between each outside group and its adjacent center group over the tubular target, an apex of each of the pair of magnetic arches separated by a certain spacing which is defined by the distances between the magnet groups and the apexes of the magnetic field arches having a spacing that is greater than the spacing between the apexes when only one group of center magnets is used.

36. A magnetron as recited in claim 30, wherein the plurality of magnets comprises:

two center groups being separated by a certain distance; and two outside groups, each outside group adjacent to a center group and spaced a certain distance therefrom, each outside group and its adjacent center group having a certain polarity so as to define a pair of magnetic arches each spanning the distance between each outside group and its adjacent center group over the tubular target the apexes of the magnetic field arches having a spacing that is defined by the distances between the magnet groups, the spacing being greater than the spacing between the apexes when the two groups of center magnets have no space between them.

37. A sputtering module for depositing a target material on a substrate, comprising;

a sputtering enclosure;

a vacuum system mounted on the enclosure for evacuating gases from the sputtering enclosure;

a pair of cylindrical magnetrons disposed proximate and parallel one to the other within the enclosure, each magnetron including:

a cylindrical tubular target having a longitudinal axis and an outside surface and a fixed length, rotatable about the longitudinal axis of the cylindrical target; and a magnetic assembly disposed within and along the length of the cylindrical tubular target, the magnetic assembly configured to provide a magnetic field racetrack over an outer surface of the tubular target, the magnetic field racetrack confining a plasma gas to erode the target material from a pair of substantially parallel erosion zones along the length of the tubular target, each pair of erosion zones defining a source plane for each target and being separated by a distance therebetween, and the magnetic assembly configured to fix the distance between the erosion zones to create an area of substantially uniform target material flux at the substrate, wherein a greater fraction of the target flux is utilized to deposit target material uniformly on the substrate than with a single zone;

wherein the magnetic assemblies are oriented relative to each other such that, at the substrate, an included angle is formed between a pair of planes, normal to the source planes and passing through the axis of each target, and the target flux of each of the targets combines to create a wider area of uniform flux at the substrate than from each target separately; and wherein each magnetron has an electrode so that an electric field can be established between the magnetrons to enable the plasma gas of a certain density to form;

rotation means for imparting to each of the tubular targets a speed of rotation with respect to the magnetic assemblies so that a substantial fraction of the outside surface is caused to pass by the magnetic assemblies in a single rotation, wherein the speed of rotation and the density of the plasma gas in the erosion zones are such as to substantially prevent accumulation of target material on regions of the target away from the sputtering zones during a rotation of the tubular target; and an alternating current electrical power supply having a first and second pole that alternate in polarity, the first pole being connected to the electrode of one of the magnetrons and the second pole being connected to the electrode of the other of the magnetrons, and the alternating current electrical power supply being operated at a preselected constant voltage, wherein each magnetron alternately deposits target material on the substrate as the poles alternate in polarity.

38. A sputtering module as recited in claim 37, wherein there is a linear array of magnetrons; and wherein the enclosure includes a baffle and shielding means for linear arrays of magnetrons.

39. A sputtering module as recited in claim 37, wherein the magnetrons are mounted vertically in the sputtering enclosure.

40. A sputtering module as recited in claim 37, wherein a reactive gas having a certain flow is introduced into the sputtering enclosure and the flow of the reactive gas is maintained constant.

41. A sputtering module as recited in claim 37, wherein a reactive gas having a certain flow is introduced into the sputtering enclosure and the flow of the reactive gas is servo-controlled to maintain constant electrical current.

42. A sputtering module as recited in claim 37, wherein each of the magnetic assemblies includes a device for independently scanning the magnetic assemblies in a predetermined pattern with respect to a fixed substrate position.

43. A sputtering module as recited in claim 37, wherein the alternating current power supply having a certain frequency is operated in a frequency range of ten to several hundreds of kilohertz.

44. A sputtering module as recited in claim 37, wherein the rotation means provides rotational speeds for the magnetrons in a range of 10 to 100 RPM, and wherein the magnetrons contain no dynamic vacuum-to-coolant seals.

45. A sputtering module as recited in claim 37, wherein different target materials and a baffle are used to form an epitaxial target material layer over a preceding target material layer on the substrate.

46. A batch sputtering machine for depositing insulating and semiconducting films on wafer-like substrates, comprising:

one or more of the sputtering modules as recited in claim 37, disposed in a vacuum chamber and having a deposition region;

a removable rotating substrate holder disposed in the vacuum chamber, which carries substrates sequentially and repeatedly past the deposition region of the sputtering module; and shutter means for isolating substrates from the rotatable cylindrical magnetrons during startup.

47. A batch sputtering machine as recited in claim 46, wherein the substrate holder forms dynamic seals between the sputtering modules which enable the depositing of different materials sequentially and simultaneously.

48. A batch sputtering machine as recited in claim 46, wherein the substrate holder contains internal passages and feed through means for passing, a coolant fluid through the substrate holder during coating operations.

49. An in-line sputtering machine for depositing insulating and semiconducting films on substrates, comprising;

one or more of the sputtering modules as recited in claim 37 disposed in a vacuum chamber;

linear transport means for passing substrates past the sputtering modules; and vacuum load and unload means for passing substrates from air to vacuum for processing and back to air in a continuous flow.

50. An in-line sputtering machine as recited in claim 49, wherein the sputtering modules are mounted vertically and disposed in pairs opposite each other for coating both sides of substrates simultaneously.

51. A magnetron assembly comprising:

a tubular target having an inner and outer surface;

a target supporting assembly for supporting the tubular target, the target support assembly including:

means for receiving rotation from an external drive source;

a first and second tubular target support for holding the tubular target, the first tubular target support fastened to one opening of the tubular target and the second tubular target support fastened to the other opening;

a target support tube that connects the rotation receiving means to the first tubular target support;

a first and second set of sealing static O-rings for sealing the first and second tubular target supports, respectively, against the tubular target; and a set of bearings disposed in an annular ring between the rotation receiving means and the target tube support tube to permit rotation therebetween;

a mounting assembly for securing the target supporting assembly for rotation, the mounting assembly including:

insulated mounting flange having a bore and fastened to a stationary support plane;

a rotary vacuum feedthrough having a bore and disposed within the bore of the mounting flange, the bore of the rotary vacuum feedthrough receiving the target support tube, the first tubular target support positioned against one opening of the feedthrough bore and the rotation receiving means positioned near the other opening of the feedthrough bore;

a set of static O-rings for sealing the feedthrough against the mounting flange;

a set of O-ring seals for sealing the feedthrough against the target support tube disposed within the feedthrough bore;

a first and second set of bearings disposed with a first and second annular rings, respectively, between the rotary vacuum feedthrough and the target support tube for rotation therebetween; and an insulating alignment flange for receiving, within a cylindrical pocket in the flange and supporting for rotation, the second tubular target support, the insulating alignment flange having a set of bearings disposed within the annular ring between the flange pocket and the lower tubular target support;

a magnet assembly disposed within the tubular target and along its length, the magnet assembly for providing magnetic field over the tubular target defining an erosion zone of the tubular target and having a passage through which a cooling fluid flows to cool the assembly;

a stationary assembly including:

secondary support tube disposed within the target support tube and concentrically within the tubular target and along the length of the tubular target; an electrical commutator connected to the secondary support tube and making electrical contact with the rotation receiving means;

at least two magnet assembly support clamps fastened about the secondary support tube to support the magnet assembly in proximity to the inner surface of the tubular target; and a first and second set of bearings disposed in first and second annular gaps between the secondary support tube and the first and second target supports, respectively, to permit rotation of the first and second target supports relative to the secondary support tube; and a cooling assembly including:

a cooling tube disposed within and along the length of the secondary support tube, the cooling tube connected to the cooling passage in the magnet assembly to convey cooling fluid through the magnet assembly and near the erosion zone of the tubular target; and a fluid input and output port for injecting cool fluid and extracting the heated fluid from the cooling tube.

52. The magnetron assembly as recited in claim 51, wherein seals for sealing the feedthrough against the target support tube are ferrofluidic type seals.

53. The magnetron assembly as recited in claim 51, wherein the mounting assembly is fastened to a horizontal plane so that the tubular target is oriented vertically in space.

54. The magnetron assembly as recited in claim 51, wherein the tubular target includes a carrier tube connected to the first and second target supports and having an outer surface covered with the target material.

55. The magnetron assembly as recited in claim 51, wherein the cooling tube has a first opening connected to one end of the passage in the magnet assembly and a second opening connected to the other end of the passage in the magnet assembly.

56. A method of operating a sputtering process to deposit target material onto a moving substrate to achieve a given coating stoichiometry, the method comprising the steps of:

introducing a flow of a sputtering gas into an evacuated chamber in which the substrate and target material reside;

introducing a flow of reactive gas into the evacuated chamber to cause the deposition of a combination of the target material and the reactive gas onto the substrate;

connecting the target material to a voltage source that provides a voltage to cause sputtering gas ions to erode the target material, said voltage source maintaining an electric current in the sputtering gas ions;

forming an intense magnetic field over the target material to confine the sputtering gas ions over a pair of substantially parallel erosion zones on the target material, the target material from the erosion zones combining to create an area of substantially uniform target material flux at the substrate;

maintaining the sputtering gas flow and the voltage approximately constant; and controlling the reactive gas flow with a feedback loop to maintain the electric current approximately constant and to compensate for coating variations caused by the variations in pumping speed due to the moving substrate.

57. A method of operating a sputtering process as recited in claim 56, wherein the voltage source has a power indicator that provides an indication of the power consumed by the sputtering process; and wherein a feedback loop controls the reactive gas flow to maintain the power constant.

58. A method of operating a sputtering process as recited in claim 56, wherein the target material has a cylindrical form of a certain length with a longitudinal axis, an axis of rotation being defined by the longitudinal axis of the cylindrical form; and further comprising the step of rotating the target material about the axis of rotation and relative to the magnetic field over the target to improve target material utilization.

59. A method of operating a sputtering process to alternately deposit layers from first material and second material from first and second targets, respectively, onto a stationary substrate, the method comprising the steps of:

introducing a flow of sputtering gas into an evacuated chamber in which the substrate and first and second target material reside, the sputtering gas being pumped into the chamber at a specified speed;

connecting the first and second target each to a voltage source that provides a voltage to cause sputtering gas ions to erode the target material, the voltage source alternately activating each target to alternately deposit layers from first and second material onto the substrate;

forming an intense magnetic field over the first target material to confine the sputtering gas ions over a pair of substantially parallel erosion zones on the first target material;

forming an intense magnetic field over the second target material to confine the sputtering gas ions over a pair of substantially parallel erosion zones on the second target material, the erosion zones on each target material combining to create an area of substantially uniform target material flux at the substrate;

maintaining the sputtering gas flow, the voltage and the pumping speed approximately constant; and scanning separately each magnetic field over the target that is activated to sweep the target material flux across the substrate and alternately deposit layers from the first and second target material onto the substrate.

60. A method of operating a sputtering process as recited in claim 59, further comprising:

introducing a flow of reactive gas into the evacuated chamber, the layers from the first and second target material being a combination of the target material and the reactive gas; and maintaining the reactive gas flow approximately constant.

* * * * *